(12) United States Patent
Kang et al.

(10) Patent No.: US 9,928,330 B2
(45) Date of Patent: Mar. 27, 2018

(54) METHOD OF DECOMPOSING LAYOUT OF SEMICONDUCTOR DEVICE AND METHOD OF MANUFACTURING SEMICONDUCTOR DEVICE USING THE SAME

(71) Applicants: Dae-Kwon Kang, Yongin-si (KR); Ji-young Jung, Hwaseong-si (KR); Dong-Gyun Kim, Seoul (KR); Jae-Seok Yang, Hwaseong-si (KR); Sung-Wook Hwang, Gyeongsangbuk-do (KR)

(72) Inventors: Dae-Kwon Kang, Yongin-si (KR); Ji-young Jung, Hwaseong-si (KR); Dong-Gyun Kim, Seoul (KR); Jae-Seok Yang, Hwaseong-si (KR); Sung-Wook Hwang, Gyeongsangbuk-do (KR)

(73) Assignee: Samsung Electronics Co., Ltd., Gyeonggi-Do, (KR)

( * ) Notice: Subject to any disclaimer, the term of this patent is extended or adjusted under 35 U.S.C. 154(b) by 235 days.

(21) Appl. No.: 14/737,244

(22) Filed: Jun. 11, 2015

(65) Prior Publication Data

US 2016/0070838 A1    Mar. 10, 2016

(30) Foreign Application Priority Data

Sep. 4, 2014  (KR) .......................... 10-2014-0117785

(51) Int. Cl.
| | |
|---|---|
| H01L 21/311 | (2006.01) |
| G06F 17/50 | (2006.01) |
| H01L 21/027 | (2006.01) |
| H01L 21/768 | (2006.01) |

(52) U.S. Cl.
CPC ...... *G06F 17/5068* (2013.01); *G06F 17/5081* (2013.01); *H01L 21/0274* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 8,111,921 B2 | 2/2012 | Hsu et al. | |
| 8,219,939 B2 | 7/2012 | Schultz et al. | |
| 8,359,556 B1 | 1/2013 | Abou Ghaida et al. | |
| 8,484,607 B1 | 7/2013 | Tang et al. | |
| 8,516,403 B2 | 8/2013 | Abou Ghaida et al. | |
| 8,516,407 B1 | 8/2013 | Wang et al. | |
| 8,598,712 B2 | 12/2013 | Huang et al. | |
| 2009/0125866 A1 | 5/2009 | Wang et al. | |

(Continued)

FOREIGN PATENT DOCUMENTS

JP    4779003 B2    9/2011

*Primary Examiner* — Angel Roman
(74) *Attorney, Agent, or Firm* — Harness, Dickey & Pierce, P.L.C.

(57) ABSTRACT

In a method of decomposing a layout of a semiconductor device, a polygon, which includes a plurality of intersections at each of which at least two lines are crossed, among polygons included in the layout of the semiconductor device may be determined as a complex polygon. A first stitch may be inserted between the plurality of intersections on the complex polygon. A plurality of decomposed patterns may be generated by performing a pattern dividing operation on the layout.

17 Claims, 39 Drawing Sheets

(56) References Cited

U.S. PATENT DOCUMENTS

| | | | |
|---|---|---|---|
| 2011/0003254 A1 | 1/2011 | Chang et al. | |
| 2012/0196230 A1* | 8/2012 | Cho | G03F 7/70433 430/319 |
| 2012/0210279 A1* | 8/2012 | Hsu | G03F 1/70 716/53 |
| 2013/0198696 A1 | 8/2013 | Wang et al. | |
| 2013/0219347 A1* | 8/2013 | Zou | G03F 1/70 716/52 |
| 2013/0339911 A1 | 12/2013 | Hsu et al. | |
| 2014/0047398 A1 | 2/2014 | Castro-Pareja et al. | |
| 2014/0089868 A1 | 3/2014 | Friedberg et al. | |
| 2015/0227666 A1* | 8/2015 | Seo | G06F 17/5072 716/53 |

\* cited by examiner

DCP1

DCP2

DCP1

DCP2

DCP2

METHOD OF DECOMPOSING LAYOUT OF SEMICONDUCTOR DEVICE AND METHOD OF MANUFACTURING SEMICONDUCTOR DEVICE USING THE SAME

CROSS-REFERENCE TO RELATED APPLICATION(S)

This application claims priority under 35 USC § 119 to Korean Patent Application No. 10-2014-0117785, filed on Sep. 4, 2014 in the Korean Intellectual Property Office (KIPO), the contents of which are herein incorporated by reference in their entirety.

BACKGROUND

1. Technical Field

Example embodiments relate to a method of manufacturing a semiconductor device, and more particularly to a method of decomposing a layout of a semiconductor device.

2. Description of Related Art

In manufacturing a high density semiconductor device, a double patterning technology (DPT) process is generally used to avoid a conflict between patterns included in a layout of the semiconductor device. In the DPT process, a layout of a semiconductor device is decomposed into two patterns, and a wiring pattern is formed on a substrate by performing a lithography process on the substrate two times using the two patterns.

Recently, a triple patterning technology (TPT) process, in which a layout of a semiconductor device is decomposed into three patterns, and a wiring pattern is formed on a substrate by performing a lithography process on the substrate three times using the three patterns, and a quadruple patterning technology (QPT) process, in which a layout of a semiconductor device is decomposed into four patterns, and a wiring pattern is formed on a substrate by performing a lithography process on the substrate four times using the four patterns, have been developed.

As described above, a layout of a semiconductor device may be decomposed into a plurality of decomposed patterns to perform the DPT process, the TPT process or the QPT process. However, when pattern densities of the plurality of decomposed patterns are different from each other, a critical dimension uniformity may be affected and a loading effect may increase while performing a mask manufacturing process and an etching process based on the plurality of decomposed patterns.

SUMMARY

Example embodiments relate to a method of decomposing a layout of a semiconductor device that effectively reduces a difference between pattern densities of a plurality of decomposed patterns.

Example embodiments relate to a method of manufacturing a semiconductor device using the method of decomposing a layout of a semiconductor device.

According to example embodiments, a method of decomposing a layout of a semiconductor device includes determining a polygon is a complex polygon among polygons included in the layout of the semiconductor device, inserting a first stitch between the plurality of intersections on the complex polygon, and generating a plurality of decomposed patterns by performing a pattern dividing operation on the layout. Each complex polygon includes a plurality of intersections where at least two lines are crossed.

In example embodiments, the inserting the first stitch may include inserting the first stitch at a center of two adjacent intersections among the plurality of intersections included in the complex polygon.

In example embodiments, the layout may include a plurality of the complex polygons, and the inserting the first stitch may include inserting the first stitch between the plurality of intersections on at least one of the plurality of the complex polygons.

In example embodiments, the generating the plurality of decomposed patterns may include separating the plurality of decomposed patterns into different decomposed patterns from each other based on at least a first part of the complex polygon and a second part of the complex polygon. The first part of the complex polygon may be on one side of the first stitch. The second part of the complex polygon may be on an other side of the first stitch.

In example embodiments, the method may further include inserting a first separator between two polygons that are within a critical dimension from each other, among the polygons included in the layout.

In example embodiments, the generating the plurality of decomposed patterns may include separating the plurality of decomposed patterns into different decomposed patterns from each other based on at least the two polygons. The two polygons may be located at respective sides of the first separator.

In example embodiments, the method may further include determining if an odd cycle is formed among the polygons in the layout that are connected to the first separator. If the odd cycle if formed, the method may further include inserting a second stitch on one of the odd numbers of the polygons included in the odd cycle.

In example embodiments, the generating the plurality of decomposed patterns may include separating the plurality of decomposed patterns into different decomposed patterns from each other based on at least the two polygons, a first part of a polygon including the second stitch, and a second part of the polygon including the second stitch. The first part of the polygon including the second stitch may be on one side of the second stitch. The second part of the polygon including the second stitch may be on the other side of the second stitch.

In example embodiments, the method may further include inserting a second separator between two polygons that are adjacent to each other by a distance greater than the critical dimension, among the polygons included in the layout.

In example embodiments, the generating the plurality of decomposed patterns may include separating the plurality of decomposed patterns into different decomposed patterns from each other based on at least the two polygons. The two polygons may be located at respective sides of the second separator.

In example embodiments, the generating the plurality of decomposed patterns may include assigning a first priority while performing the pattern dividing operation to the second separator if the second separator is inserted between a first polygon and a second polygon that is apart from the first polygon more than the critical dimension in a direction corresponding to a minor axis of the first polygon. The generating the plurality of decomposed patterns may include assigning a second priority while performing the pattern dividing operation to the second separator if the second separator is inserted between the first polygon and a third polygon that is apart from the first polygon more than the critical dimension in a direction corresponding to a major axis of the first polygon.

In example embodiments, the generating the plurality of decomposed patterns by performing the pattern dividing operation on the layout may include assigning the two polygons located at respective sides of the first separator to different decomposed patterns from each other among the plurality of decomposed patterns, assigning a polygon that is adjacent to the second separator having the first priority, among unassigned polygons included in the layout, to one of the plurality of decomposed patterns, and assigning a polygon that is adjacent to the second separator having the second priority, among unassigned polygons included in the layout, to one of the plurality of decomposed patterns.

In example embodiments, the pattern dividing operation may be performed using a double pattern dividing algorithm for a double patterning technology (DPT) process.

In example embodiments, a number of the plurality of decomposed patterns may be two.

In example embodiments, the plurality of decomposed patterns may be displayed with different colors from each other.

In example embodiments, the semiconductor device may correspond to a system-on-chip.

According to example embodiments, a method of manufacturing a semiconductor device may include performing the above-described method of decomposing a layout of a semiconductor device, generating a plurality of masks corresponding to the plurality of decomposed patterns, respectively, and a wiring pattern on a substrate by performing lithography processes on the substrate a plurality using the plurality of masks.

In example embodiments, the method may further include inserting a first separator between two polygons that are within a critical dimension from each other, among the polygons included in the layout.

In example embodiments, the method may further include determining if an odd cycle is formed among the polygons in the layout that are connected to the first separator. If the odd cycle if formed, the method may further include inserting a second stitch on one of the odd numbers of the polygons included in the odd cycle.

In example embodiments, the method may further comprise inserting a second separator between two polygons that are adjacent from each other by a distance greater than the critical dimension, among the polygons included in the layout.

According to example embodiments, a method of decomposing a layout of a semiconductor device includes inserting a first separator between two polygon that are within a critical dimension from each other, among polygons included in the layout of the semiconductor device; inserting a second separator between two polygons that are adjacent from each other by a distance greater than the critical dimension, among the polygons included in the layout; and generating a plurality of decomposed patterns by performing a pattern dividing operation on the layout.

In example embodiments, the method may further include determining if an odd cycle is formed among the polygons included in the layout that are connected by the first separators. If the odd cycle is formed, a stitch may be inserted on one of the odd numbers of the polygons included in the odd cycle.

In example embodiments, the method may further include determining a polygon is a complex polygon among polygons in the layout, the complex polygon including a plurality of intersections where at least two lines are crossed, and inserting a first stitch between the plurality of intersections on the complex polygon.

According to example embodiments, a method of decomposing a layout of a semiconductor device is provided. The layout includes a plurality of polygons. The method includes inserting in the layout at least one of a first stitch between the plurality of intersections where at least two lines are crossed in at least one complex polygon, if the plurality of polygons include the at least one complex polygon, and a first separator between two polygons that are spaced apart from each other by a distance less than a critical dimension, if the plurality of polygons include the two polygons that are spaced apart from each other by the distance less than the critical dimension. The method may further include generating a plurality of decomposed patterns by performing a pattern dividing operation on the layout.

In example embodiments, the method may include inserting the first stitch between the plurality of intersections where at least two lines are crossed in the at least one complex polygon, the generating the plurality of decomposed patterns may include separating the plurality of decomposed patterns into different decomposed patterns based on at least a position of each first each in the at least one complex polygon, the different decomposed patterns may include first decomposed patterns and second decomposed patterns, the first decomposed patterns may be based on at least a first part of the at least one complex polygon that is on a first side of each stitch, the second decomposed patterns may be based on at least a second part of the at least one complex polygon that is on an other side of each first stitch, and the first decomposed patterns may be different than the second decomposed patterns.

In example embodiments, the method may include inserting the first separator between two polygons that are spaced apart from each other by the distance less than the critical dimension, the generating the plurality of decomposed patterns may include separating the plurality of decomposed patterns into different decomposed patterns based on at least a position of the first separator relative to the two polygons that are spaced apart from each other by the distance less than the critical dimension, the different decomposed patterns may include first decomposed patterns and second decomposed patterns, at least part of the first decomposed patterns may be based on one of the two polygons that are spaced apart from each other by the distance less than the critical dimension, at least part of the second decomposed patterns may be based on an other one of the two polygons that are spaced apart from each other by the distance less than the critical dimension, and the first decomposed patterns may be different than the second decomposed patterns.

In example embodiments, the method may further include inserting a second separator between two polygons that are spaced apart from each other by a distance greater than the critical dimension if the plurality of polygons include the two polygons that are spaced apart from each other by a distance greater than the critical dimension.

According to example embodiments, a method of manufacturing a semiconductor device may include performing the above-described method of decomposing a layout of a semiconductor device, generating a plurality of masks corresponding to the plurality of decomposed patterns, respectively, and a wiring pattern on a substrate by performing lithography processes on the substrate a plurality using the plurality of masks.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
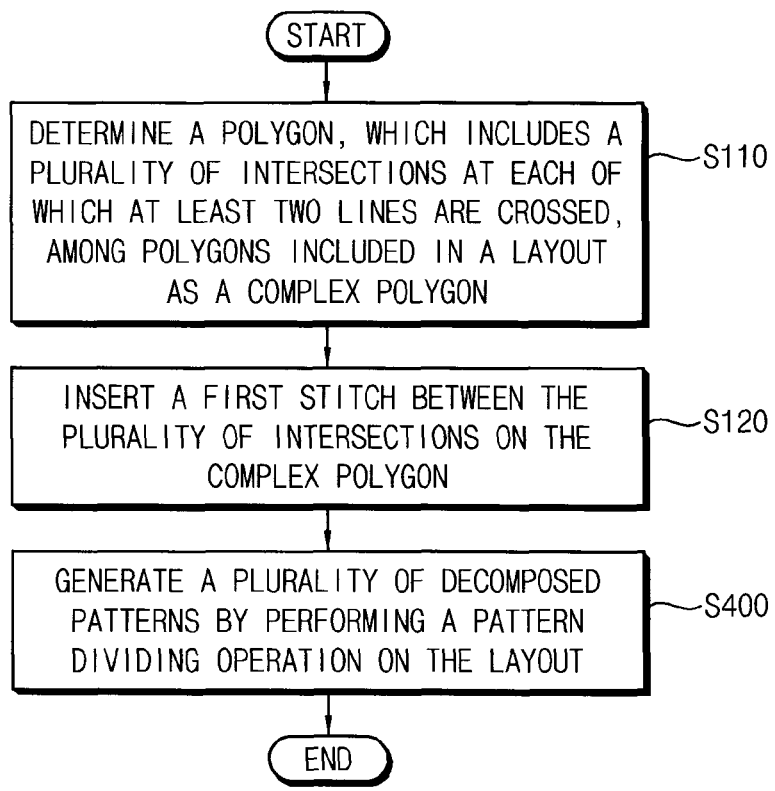
FIG. 1 is a flow chart illustrating a method of decomposing a layout of a semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of decomposing a layout of a semiconductor device according to example embodiments.

In FIG. 1, a method of decomposing a layout of a semiconductor device, which includes polygons having different shapes, into a plurality of decomposed patterns is illustrated.

Referring to FIG. 1, a polygon, which includes a plurality of intersections at each of which at least two lines are crossed, among the polygons included in the layout of the semiconductor device is determined as a complex polygon (step S110), and a first stitch is inserted between the plurality of intersections on the complex polygon (step S120).

In example embodiments, the first stitch may be inserted at a center of two adjacent intersections among the plurality of intersections included in the complex polygon.

In example embodiments, the layout may include a plurality of the complex polygons. In this case, the first stitch may be inserted between the plurality of intersections on at least one of the plurality of the complex polygons included in the layout.

After that, a plurality of decomposed patterns are generated by performing a pattern dividing operation on the layout including the first stitch (step S400).

Each of the polygons included in the layout may be assigned to one of the plurality of decomposed patterns by the pattern dividing operation. In the case of the complex polygon including the first stitch, a first part of the complex polygon, which is on one side of the first stitch, and a second part of the complex polygon, which is on the other side of the first stitch, may be separated into different decomposed patterns from each other among the plurality of decomposed patterns by the pattern dividing operation.

In the method of decomposing a layout of a semiconductor device of FIG. 1, the pattern dividing operation may be performed using various kinds of pattern dividing algorithms.

In example embodiments, the pattern dividing operation may be performed using a double pattern dividing algorithm for a double patterning technology (DPT) process. In this case, two decomposed patterns, which include a first decomposed pattern and a second decomposed pattern, may be generated by performing the pattern dividing operation on the layout. For example, the pattern dividing operation may be performed by a pattern decomposition device used in the DPT process. According to example embodiments, the pattern decomposition device may be implemented as software, hardware, or a combination of software and hardware.

In example embodiments, the pattern dividing operation may be performed using a triple pattern dividing algorithm for a triple patterning technology (TPT) process. In this case, three decomposed patterns, which include a first decomposed pattern, a second decomposed pattern and a third decomposed pattern, may be generated by performing the pattern dividing operation on the layout. For example, the pattern dividing operation may be performed by a pattern decomposition device used in the TPT process. According to example embodiments, the pattern decomposition device may be implemented as software, hardware, or a combination of software and hardware.

In example embodiments, the pattern dividing operation may be performed using a quadruple pattern dividing algorithm for a quadruple patterning technology (QPT) process. In this case, four decomposed patterns, which include a first decomposed pattern, a second decomposed pattern, a third decomposed pattern and a fourth decomposed pattern, may be generated by performing the pattern dividing operation on the layout. For example, the pattern dividing operation may be performed by a pattern decomposition device used in the QPT process. According to example embodiments, the pattern decomposition device may be implemented as software, hardware, or a combination of software and hardware.

In example embodiments, the semiconductor device may correspond to a system-on-chip. For example, the semiconductor device may be a system-on-chip including a logic circuit. Therefore, the method of decomposing a layout of a semiconductor device of FIG. 1 may be used in manufacturing a system-on-chip.

In example embodiments, the plurality of decomposed patterns may be displayed with different colors from each other. Therefore, the plurality of decomposed patterns may be displayed in one layout diagram with high visibility. For this reason, the pattern dividing operation may be referred to as a coloring operation.

If the pattern dividing operation is performed on the layout without inserting the first stitch on the complex polygon, the complex polygon may be assigned to one of the plurality of decomposed patterns. Therefore, if a size of the complex polygon is relatively big, a difference between a pattern density of the decomposed pattern including the complex polygon and a pattern density of the decomposed pattern not including the complex polygon may be relatively great. As a difference between pattern densities of the plurality of decomposed patterns increases, a critical dimension uniformity may be affected and a loading effect may increase while performing a mask manufacturing process and an etching process based on the plurality of decomposed patterns.

However, as described above, in the method of decomposing a layout of a semiconductor device of FIG. 1, the pattern dividing operation may be performed on the layout after the first stitch is inserted between the plurality of intersections on the complex polygon. Therefore, parts of the complex polygon may be separated into the plurality of decomposed patterns based on the first stitch. As such, the difference between pattern densities of the plurality of decomposed patterns may effectively decrease.

Figure 2:
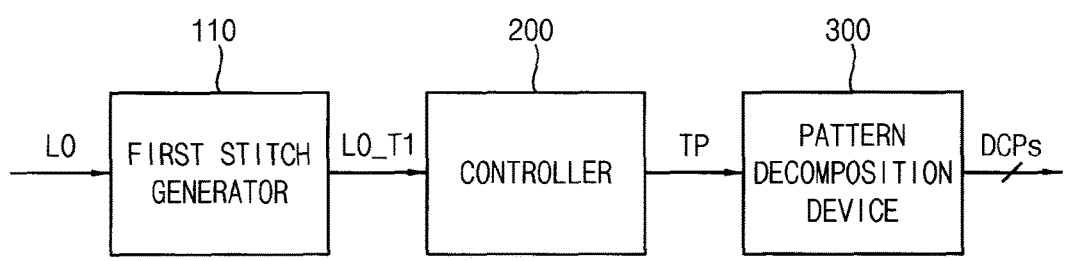
FIG. 2 is a block diagram illustrating a layout decomposition device according to example embodiments.

FIG. 2 is a block diagram illustrating a layout decomposition device according to example embodiments.

The method of decomposing a layout of a semiconductor device of FIG. 1 may be performed by a layout decomposition device 10 of FIG. 2.

Hereinafter, the method of decomposing a layout of a semiconductor device of FIG. 1 performed by the layout decomposition device 10 of FIG. 2 will be described with reference to FIGS. 1 and 2.

Referring to FIG. 2, the layout decomposition device 10 includes a first stitch generator 110, a controller 200 and a pattern decomposition device 300. In example embodiments, the controller 200 may be a hardware processor such as central processing unit (CPU), a multi-processor, a distributed processing system, an application specific integrated circuit (ASIC), and/or a suitable hardware processing unit. The stitch generator 110 may be implemented as hardware, software, or a combination of hardware and software. The pattern decomposition device 300 may be implemented as hardware, software, or a combination of hardware and software.

The first stitch generator 110 receives a layout LO of a semiconductor device.

The first stitch generator 110 may determine a polygon, which includes a plurality of intersections at each of which at least two lines are crossed, among polygons included in the layout LO of the semiconductor device as a complex polygon (step S110), and insert a first stitch between the plurality of intersections on the complex polygon to generate a first temporary layout LO_T1 (step S120).

Figure 3:
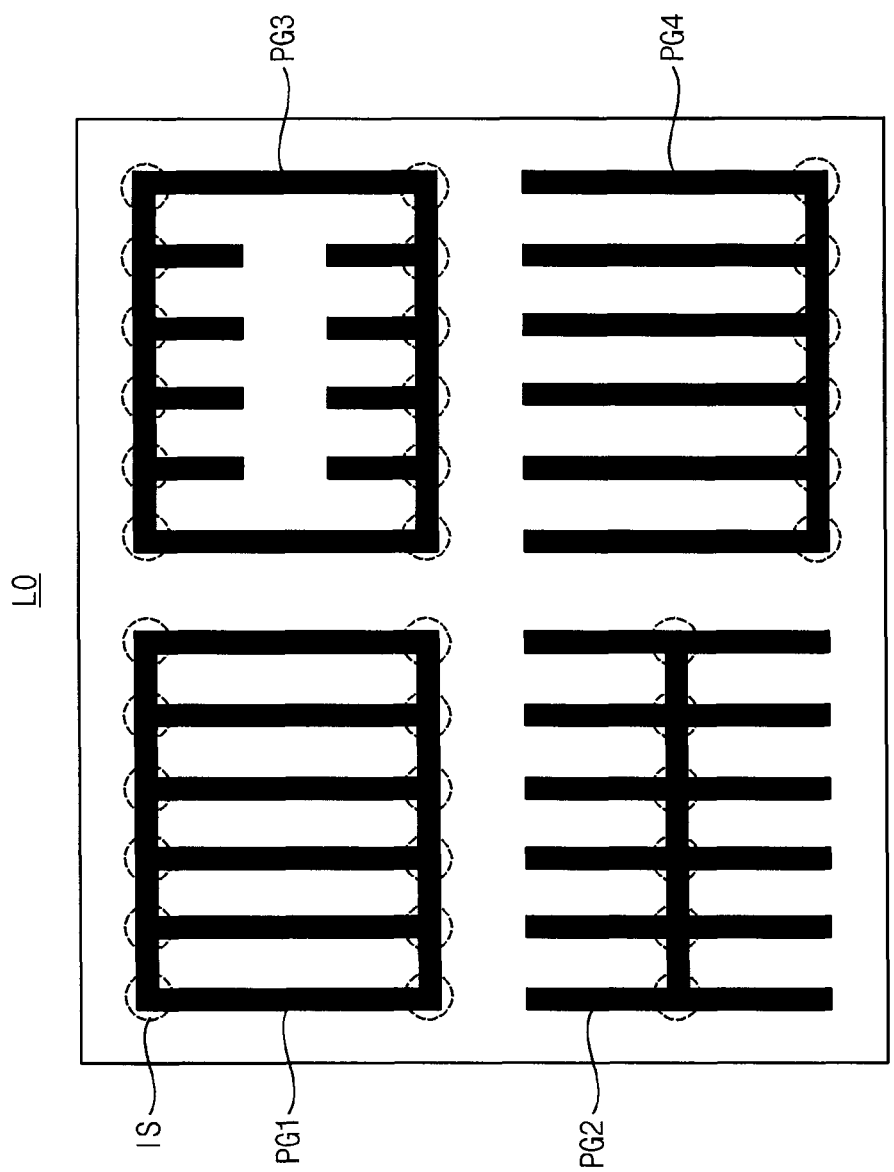
FIG. 3 is a diagram illustrating an example of a layout of a semiconductor device provided to the layout decomposition device of FIG. 2.
Figure 4:
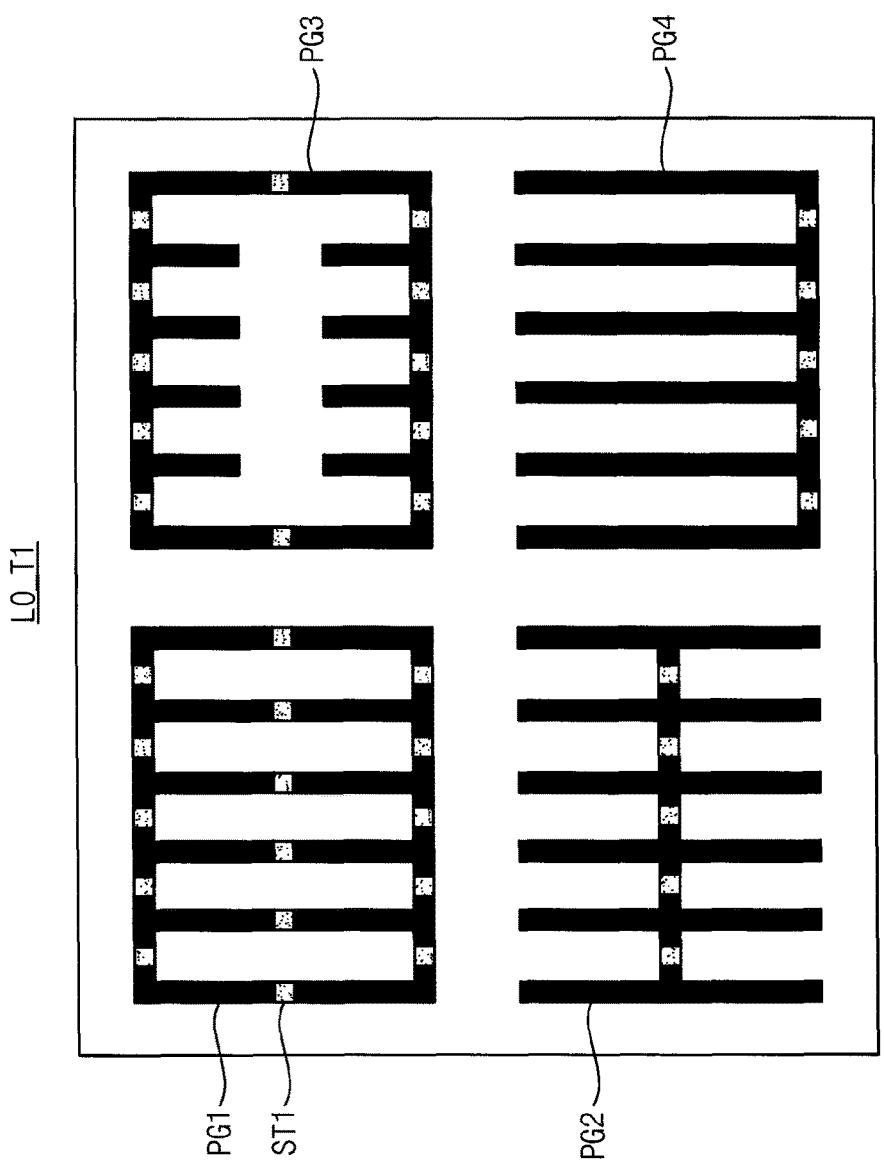
FIG. 4 is a diagram illustrating an example of a first temporary layout generated by inserting a first stitch on the layout of FIG. 3.

FIG. 3 is a diagram illustrating an example of a layout of a semiconductor device provided to the layout decomposition device of FIG. 2. FIG. 4 is a diagram illustrating an example of a first temporary layout generated by inserting a first stitch on the layout of FIG. 3.

Referring to FIG. 3, the layout LO of the semiconductor device may include a first polygon PG1, a second polygon PG2, a third polygon PG3, and a fourth polygon PG4.

The first stitch generator 110 may determine whether each of the first through fourth polygons PG1, PG2, PG3 and PG4 corresponds to the complex polygon based on a number of intersections IS at each of which at least two lines are crossed.

In FIG. 3, each of the first through fourth polygons PG1, PG2, PG3 and PG4 includes a plurality of intersections IS at each of which at least two lines are crossed. Therefore, the first stitch generator 110 may determine each of the first through fourth polygons PG1, PG2, PG3 and PG4 as the complex polygon.

Therefore, as illustrated in FIG. 4, the first stitch generator 110 may generate the first temporary layout LO_T1 by inserting the first stitch ST1 between the plurality of intersections IS on each of the complex polygons PG1, PG2, PG3 and PG4.

In the case of FIG. 4, the first stitch generator 110 inserts the first stitch ST1 between the plurality of intersections IS on all of the complex polygons PG1, PG2, PG3 and PG4 included in the layout LO. However, according to example embodiments, the first stitch generator 110 may insert the first stitch ST1 between the plurality of intersections IS on some of the complex polygons PG1, PG2, PG3 and PG4 included in the layout LO to generate the first temporary layout LO_T1.

Referring again to FIG. 2, the controller 200 receives the first temporary layout LO_T1 from the first stitch generator 110, and provides the first temporary layout LO_T1 to the pattern decomposition device 300 as a target pattern TP.

The pattern decomposition device 300 may generate a plurality of decomposed patterns DCPs by performing the pattern dividing operation on the target pattern TP (step S400).

For example, for each of the complex polygons PG1, PG2, PG3 and PG4 included in the layout LO, the pattern decomposition device 300 may separate a first part of the complex polygon, which is on one side of the first stitch ST1, and a second part of the complex polygon, which is on the other side of the first stitch ST1, into different decomposed patterns from each other among the plurality of decomposed patterns DCPs.

In example embodiments, the pattern decomposition device 300 may perform the pattern dividing operation using various kinds of pattern dividing algorithms. For example, the pattern decomposition device 300 may perform the pattern dividing operation using one of a double pattern dividing algorithm used in the DPT process, a triple pattern dividing algorithm used in the TPT process and a quadruple pattern dividing algorithm used in the QPT process.

Figure 5:
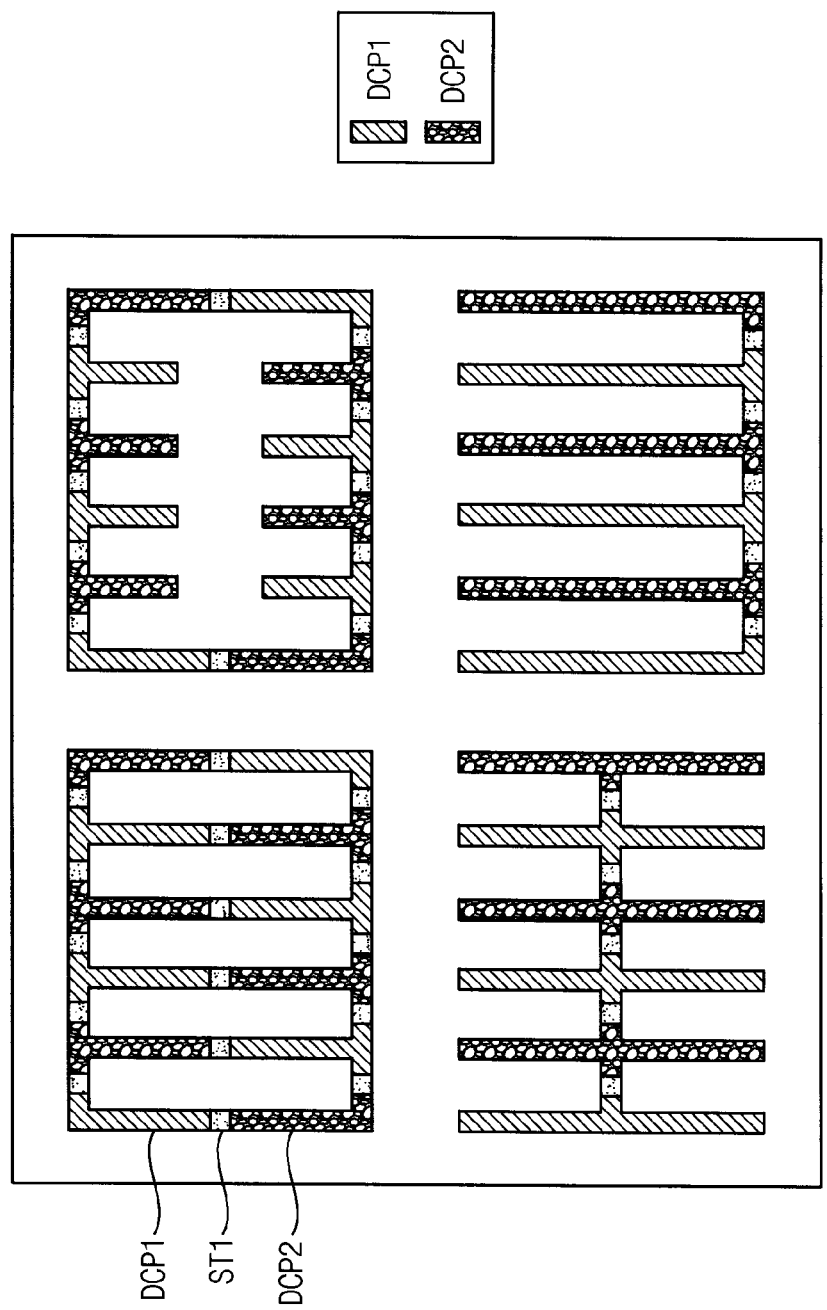
FIGS. 5, 6 and 7 are diagrams illustrating an example of a plurality of decomposed patterns generated by performing a pattern dividing operation on a target pattern.
Figure 6:
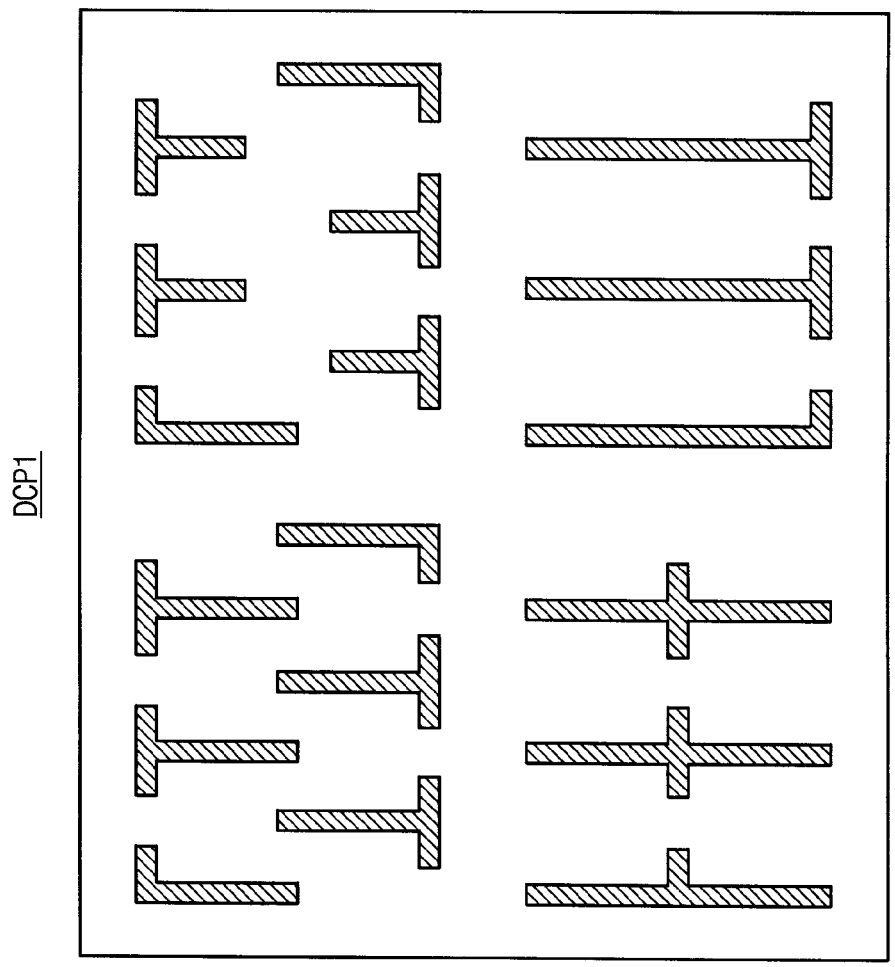
Figure 7:
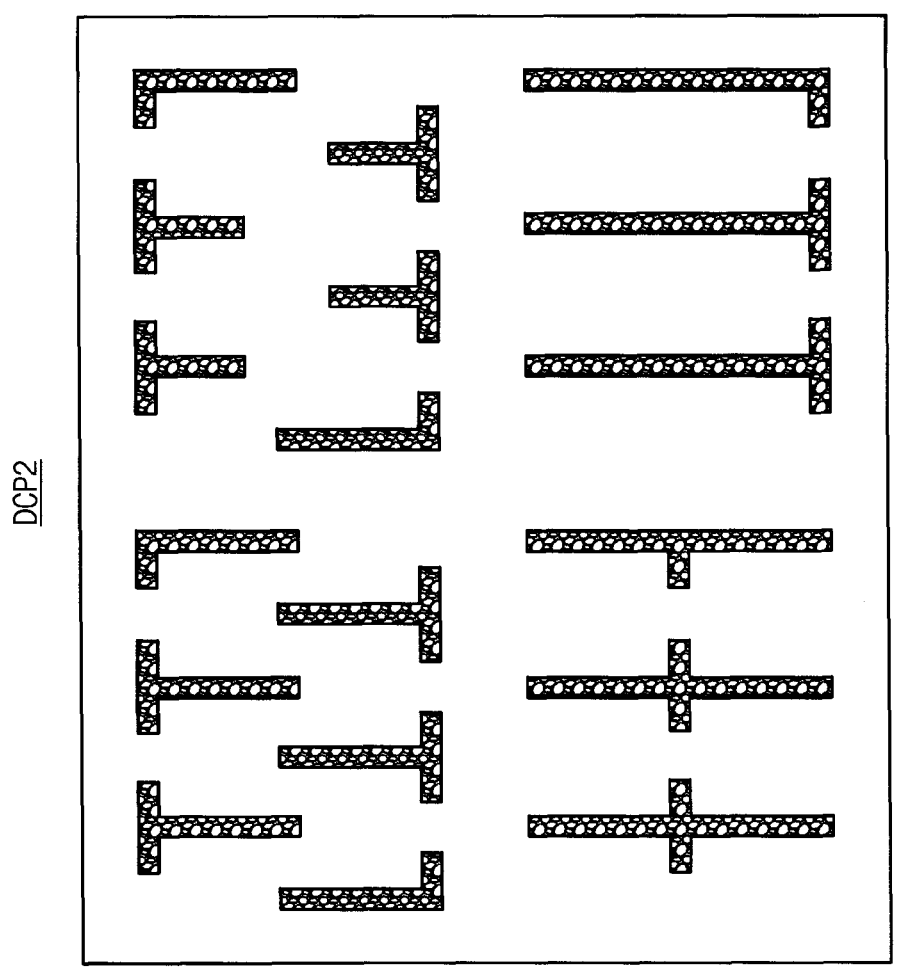

FIGS. 5, 6 and 7 are diagrams illustrating an example of a plurality of decomposed patterns generated by performing a pattern dividing operation on a target pattern.

FIG. 5 represents a result of the pattern dividing operation performed on the target pattern TP by the pattern decomposition device 300 using the double pattern dividing algorithm, which is used in the DPT process, to generate a first decomposed pattern DCP1 and a second decomposed pattern DCP2. FIGS. 6 and 7 represent the first decomposed pattern DCP1 and the second decomposed pattern DCP2 separately.

As illustrated in FIGS. 5, 6 and 7, the pattern decomposition device 300 may generate the first decomposed pattern DCP1 and the second decomposed pattern DCP2 by separating a first part of the complex polygon, which is on one side of the first stitch ST1, and a second part of the complex polygon, which is on the other side of the first stitch ST1, into the first decomposed pattern DCP1 and the second decomposed pattern DCP2, respectively, for each of the complex polygons PG1, PG2, PG3 and PG4 including the first stitch ST1. In example embodiments, an area on which the first stitch ST1 is located may be included in both the first decomposed pattern DCP1 and the second decomposed pattern DCP2.

Figure 8:
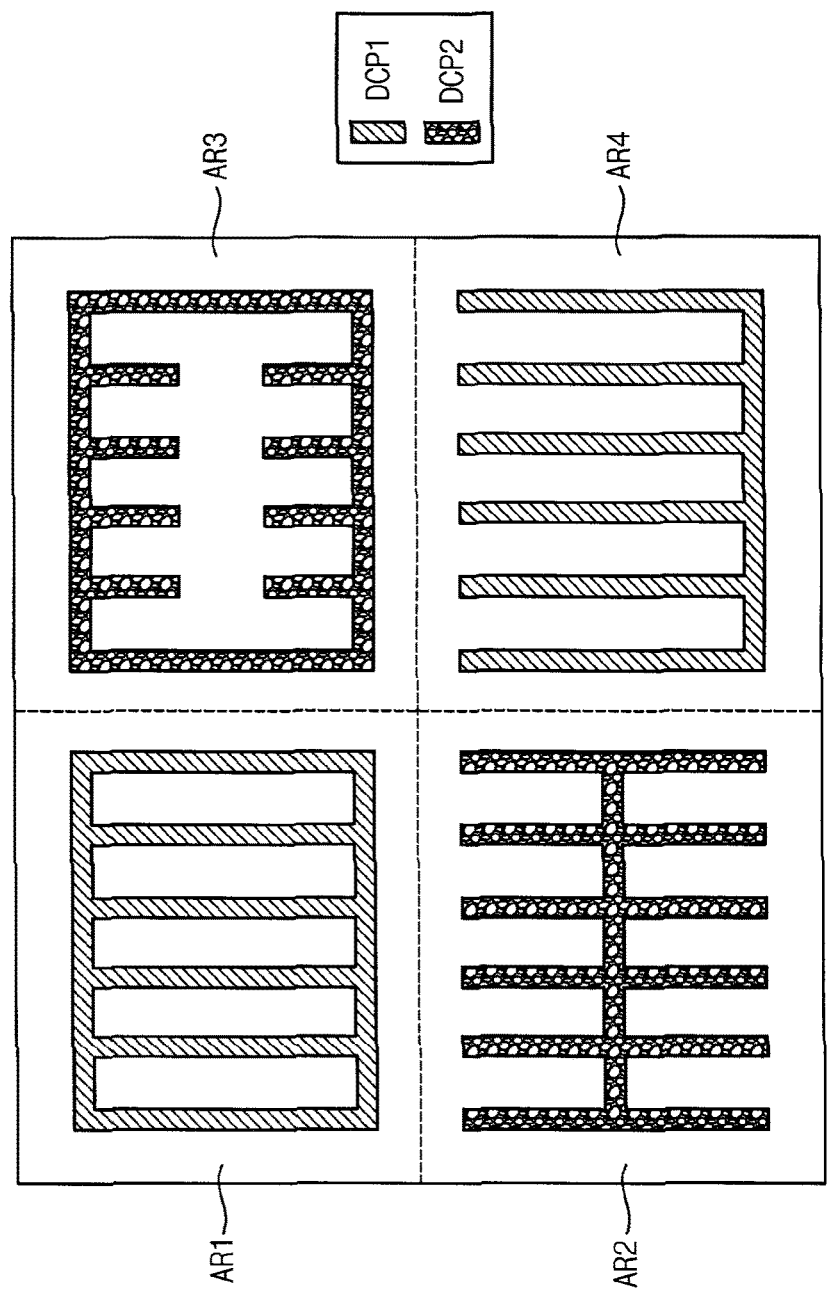
FIGS. 8, 9 and 10 are diagrams illustrating an example of a plurality of decomposed patterns generated by performing a pattern dividing operation on the layout of FIG. 3 without a first stitch.
Figure 9:
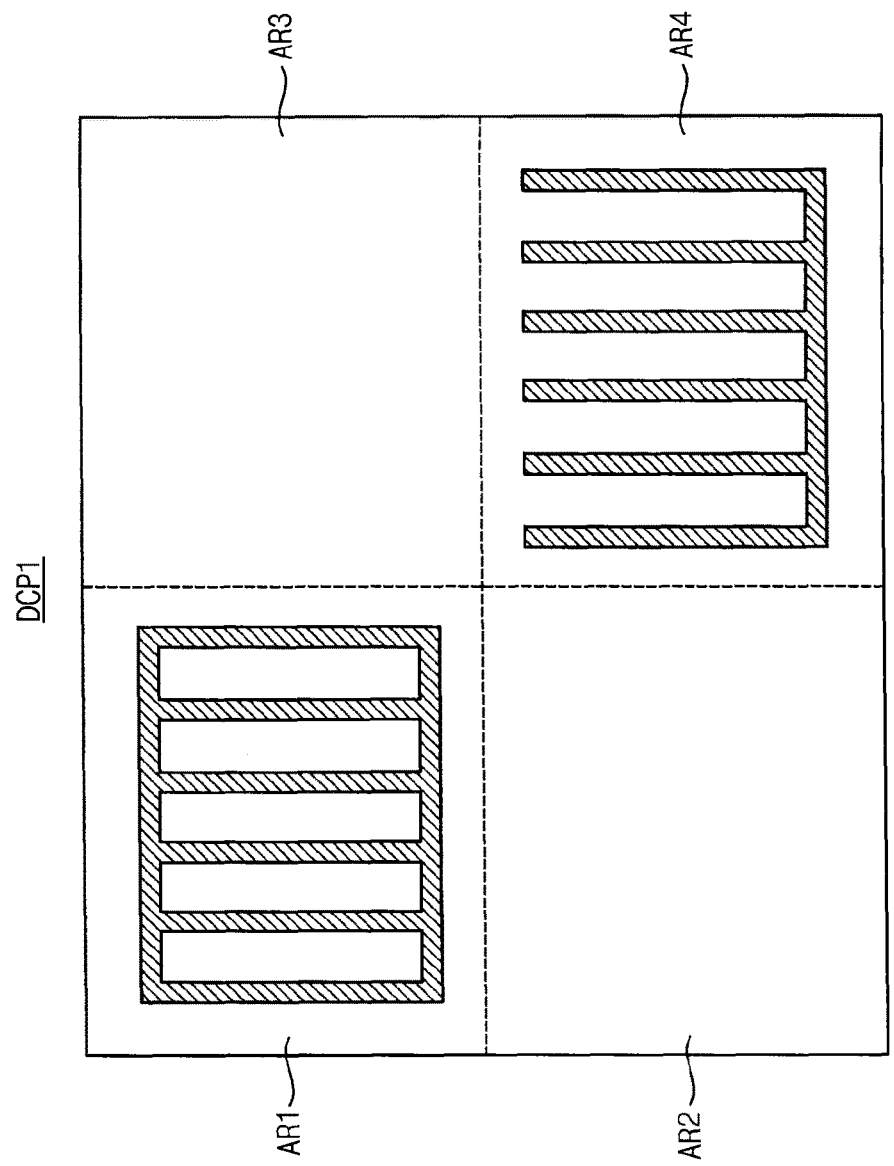
Figure 10:
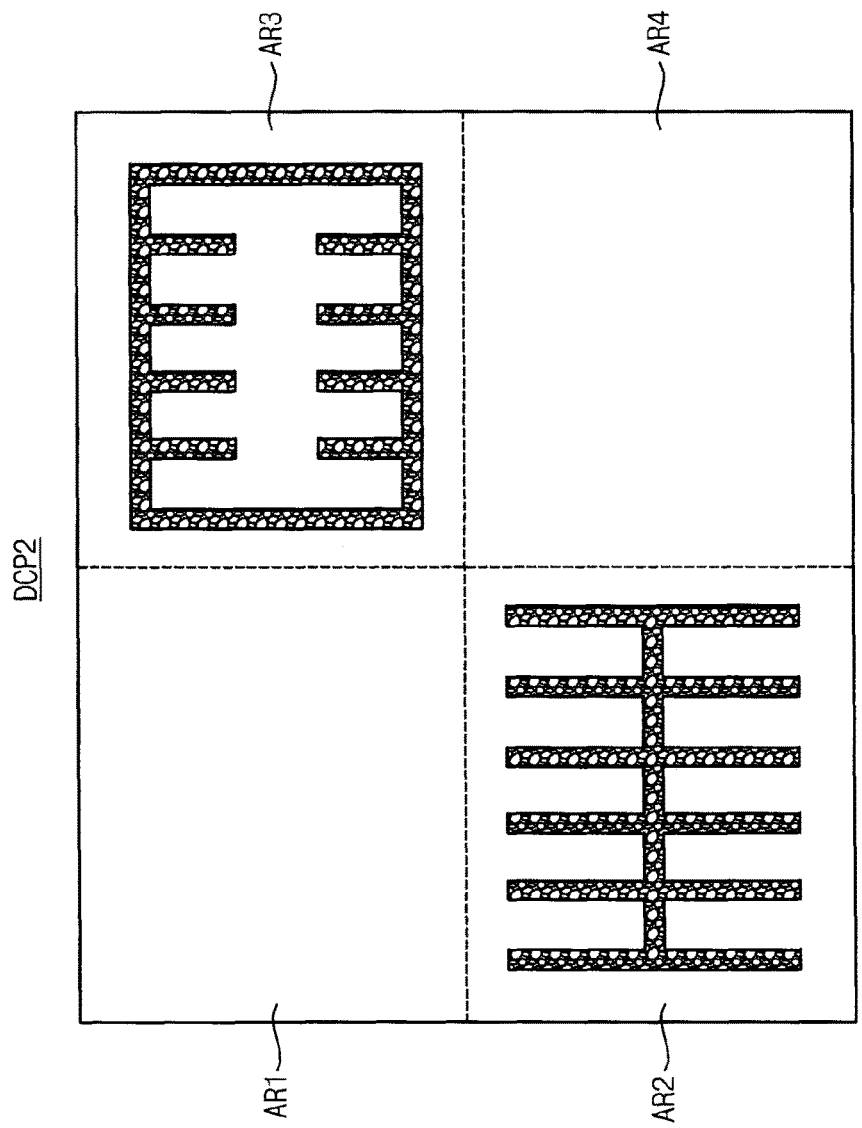

FIGS. 8, 9 and 10 are diagrams illustrating an example of a plurality of decomposed patterns generated by performing a pattern dividing operation on the layout of FIG. 3 without a first stitch.

Hereinafter, problems, which may occur when the pattern dividing operation is performed on the layout LO of FIG. 3 without inserting the first stitch ST1, will be described with reference to FIGS. 8, 9 and 10.

FIG. 8 represents a result of the pattern dividing operation performed on the layout LO, which does not include the first stitch ST1, by the pattern decomposition device 300 using the double pattern dividing algorithm, which is used in the DPT process, to generate a first decomposed pattern DCP1 and a second decomposed pattern DCP2. FIGS. 9 and 10 represent the first decomposed pattern DCP1 and the second decomposed pattern DCP2 separately.

As illustrated in FIGS. 8, 9 and 10, when the pattern decomposition device 300 performs the pattern dividing operation on the layout LO without inserting the first stitch ST1 on the first through fourth polygons PG1, PG2, PG3 and PG4, the pattern decomposition device 300 may generate the first decomposed pattern DCP1 and the second decomposed pattern DCP2 by assigning each of the first through fourth polygons PG1, PG2, PG3 and PG4 included in the layout LO to one of the first decomposed pattern DCP1 and the second decomposed pattern DCP2.

In this case, as illustrated in FIGS. 8, 9 and 10, a pattern density of the first decomposed pattern DCP1 is much higher than a pattern density of the second decomposed pattern DCP2 in a first area AR1 and a fourth area AR4, and a pattern density of the second decomposed pattern DCP2 is much higher than a pattern density of the first decomposed pattern DCP1 in a second area AR2 and a third area AR3. Therefore, a difference between local densities of patterns included in the first decomposed pattern DCP1 and the second decomposed pattern DCP2 may relatively high. As a difference between local densities of patterns included in the plurality of decomposed patterns DCPs increases, a critical dimension uniformity may be affected and a loading effect may increase while performing a mask manufacturing process and an etching process based on the plurality of decomposed patterns DCPs.

However, as described above with reference to FIGS. 1 to 7, in the method of decomposing a layout of a semiconductor device according to example embodiments, the pattern dividing operation is performed on the layout LO after the first stitch ST1 is inserted between the plurality of intersections IS on the complex polygon. Therefore, parts of the complex polygon may be separated into the first decomposed pattern DCP1 and the second decomposed pattern DCP2 based on the first stitch ST1. As such, the difference between pattern densities of the first decomposed pattern DCP1 and the second decomposed pattern DCP2 may effectively decrease.

Figure 11:
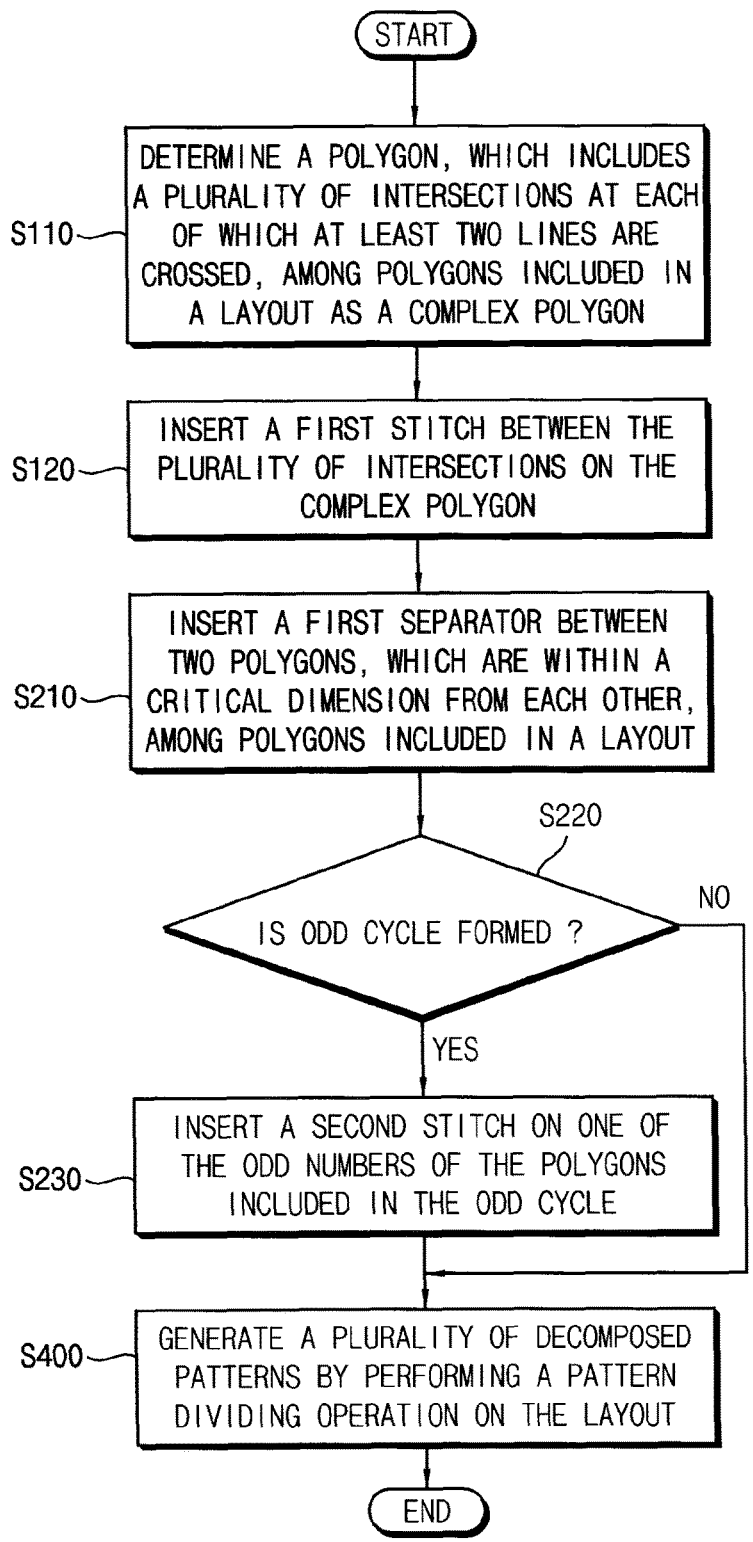
FIG. 11 is a flow chart illustrating a method of decomposing a layout of a semiconductor device according to example embodiments.

FIG. 11 is a flow chart illustrating a method of decomposing a layout of a semiconductor device according to example embodiments.

The method of decomposing a layout of a semiconductor device of FIG. 11 further includes steps S210, S220 and S230 from the method of decomposing a layout of a semiconductor device of FIG. 1. Therefore, duplicate descriptions will be omitted here.

When receiving the layout of the semiconductor device, a first separator is inserted between two polygons, which are within a critical dimension from each other, among the polygons included in the layout (step S210).

While performing the pattern dividing operation, the first separator may represent a restriction that the two polygons, which are located at both sides of the first separator, are to be separated into different decomposed patterns from each other among the plurality of decomposed patterns.

After that, it is determined whether an odd cycle, in which odd numbers of the polygons included in the layout are circularly connected by the first separators, is formed (step S220).

When the odd cycle is not formed (step S220; no), a plurality of decomposed patterns are generated by performing the pattern dividing operation on the layout including the first stitch, which is inserted on the complex polygon, and the first separator (step S400).

When the odd cycle is formed (step S220; yes), a second stitch is inserted on one of the odd numbers of the polygons included in the odd cycle (step S230). After that, a plurality of decomposed patterns are generated by performing the pattern dividing operation on the layout including the first stitch, which is inserted on the complex polygon, the first separator and the second stitch, which is inserted on one of the odd numbers of the polygons included in the odd cycle (step S400).

By performing the pattern dividing operation, a first part of the complex polygon, which is on one side of the first stitch, and a second part of the complex polygon, which is on the other side of the first stitch, may be separated into different decomposed patterns from each other among the plurality of decomposed patterns, the two polygons, which are located at both sides of the first separator, may be separated into different decomposed patterns from each other among the plurality of decomposed patterns, and a first part of a polygon including the second stitch, which is on one side of the second stitch, and a second part of the polygon including the second stitch, which is on the other side of the second stitch, may be separated into different decomposed patterns from each other among the plurality of decomposed patterns.

Figure 12:
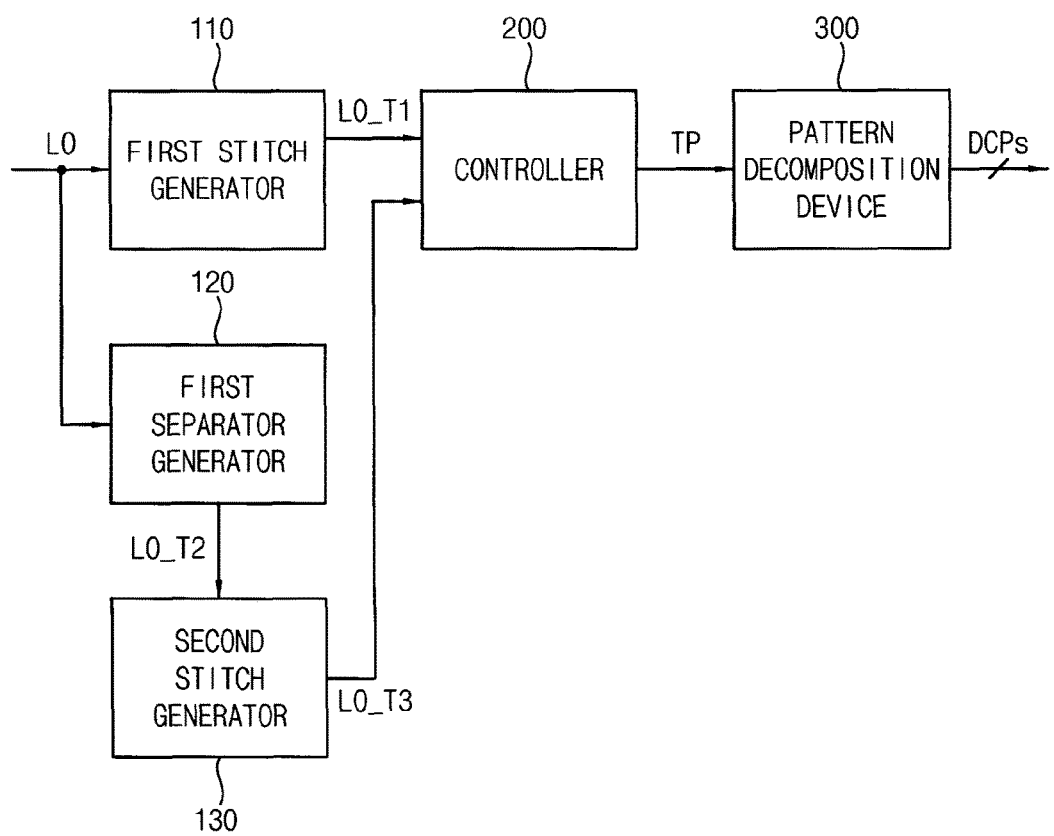
FIG. 12 is a block diagram illustrating a layout decomposition device according to example embodiments.

FIG. 12 is a block diagram illustrating a layout decomposition device according to example embodiments.

The method of decomposing a layout of a semiconductor device of FIG. 11 may be performed by a layout decomposition device 20 of FIG. 12.

The layout decomposition device 20 of FIG. 12 further includes a first separator generator 120 and a second stitch generator 130 from the layout decomposition device 10 of FIG. 2. The first separator generator 120 and the second stitch generator 130 respectively may be implemented as hardware, software, or a combination of hardware and software.

Hereinafter, the method of decomposing a layout of a semiconductor device of FIG. 11 performed by the layout decomposition device 20 of FIG. 12 will be described with reference to FIGS. 1 and 12.

The first stitch generator 110 and the first separator generator 120 receive a layout LO of a semiconductor device.

The first stitch generator 110 may determine a polygon, which includes a plurality of intersections at each of which at least two lines are crossed, among polygons included in the layout LO of the semiconductor device as a complex polygon (step S110), and insert a first stitch between the plurality of intersections on the complex polygon to generate a first temporary layout LO_T1 (step S120).

The first separator generator 120 may insert a first separator between two polygons, which are within the critical dimension from each other, among the polygons included in the layout LO to generate a second temporary layout LO_T2 (step S210).

The second stitch generator 130 may receive the second temporary layout LO_T2 from the first separator generator 120 and determine whether the odd cycle, in which odd numbers of the polygons included in the layout LO are circularly connected by the first separators, is formed in the second temporary layout LO_T2 (step S220).

When the odd cycle is not formed in the second temporary layout LO_T2 (step S220; no), the second stitch generator 130 may provide the second temporary layout LO_T2 to the controller 200 as a third temporary layout LO_T3.

When the odd cycle is formed in the second temporary layout LO_T2 (step S220; yes), the second stitch generator 130 may insert a second stitch on one of the odd numbers of the polygons included in the odd cycle to generate a third temporary layout LO_T3 (step S230), and provide the third temporary layout LO_T3 to the controller 200.

Figure 13:
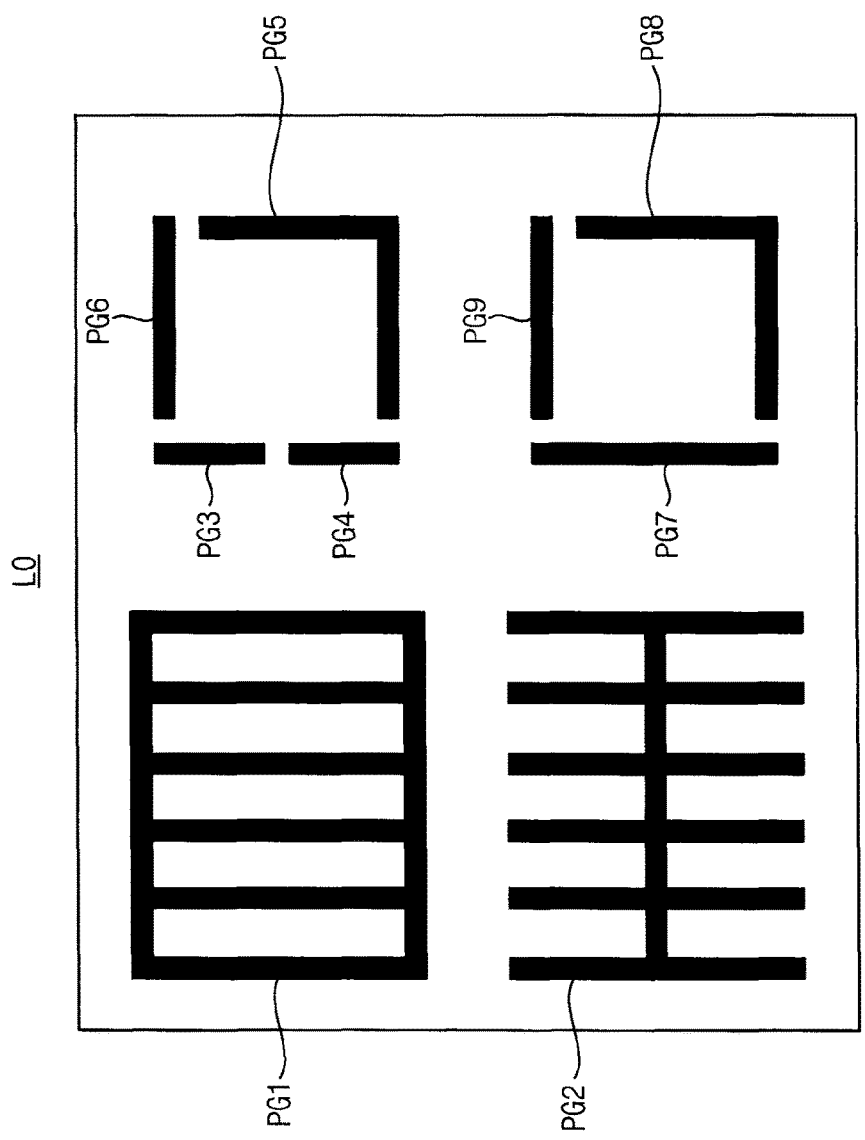
FIG. 13 is a diagram illustrating an example of a layout of a semiconductor device provided to the layout decomposition device of FIG. 12.
Figure 14:
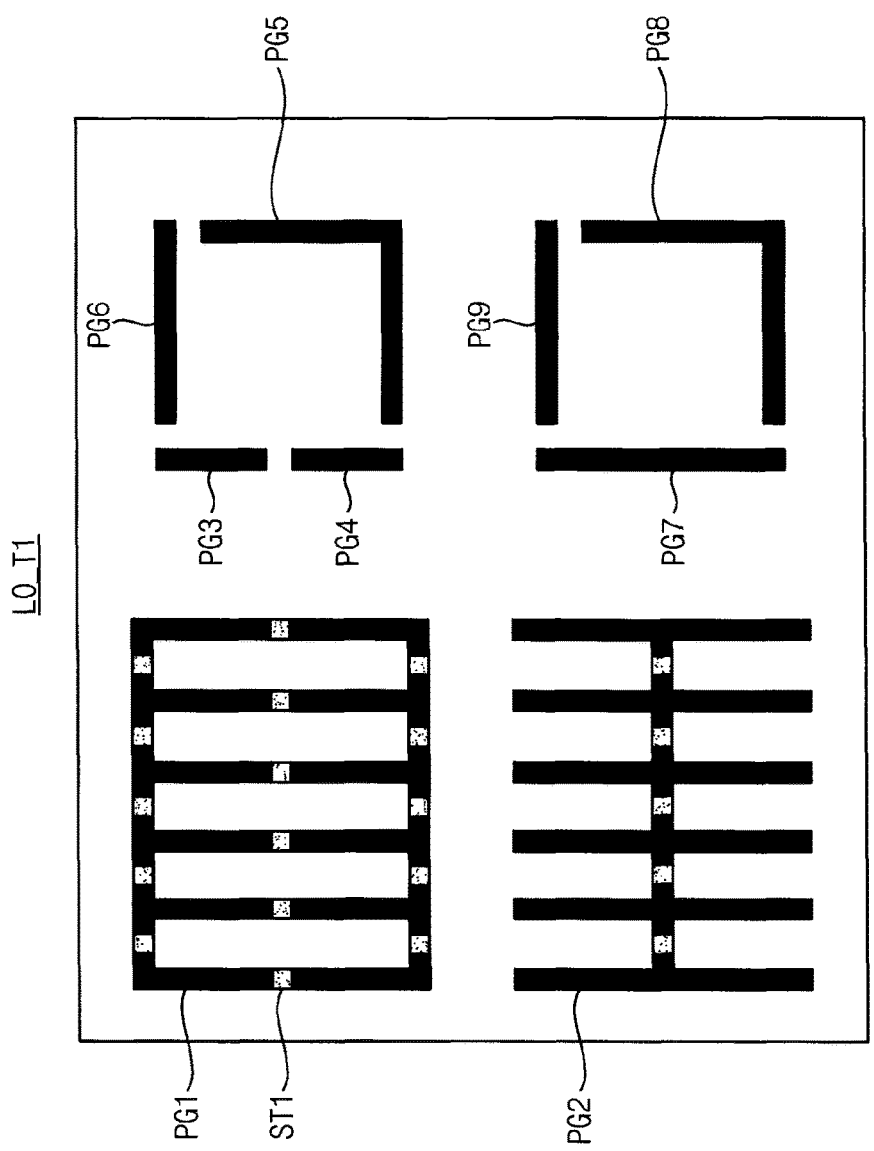
FIG. 14 is a diagram illustrating an example of a first temporary layout generated by inserting a first stitch on the layout of FIG. 13.
Figure 15:
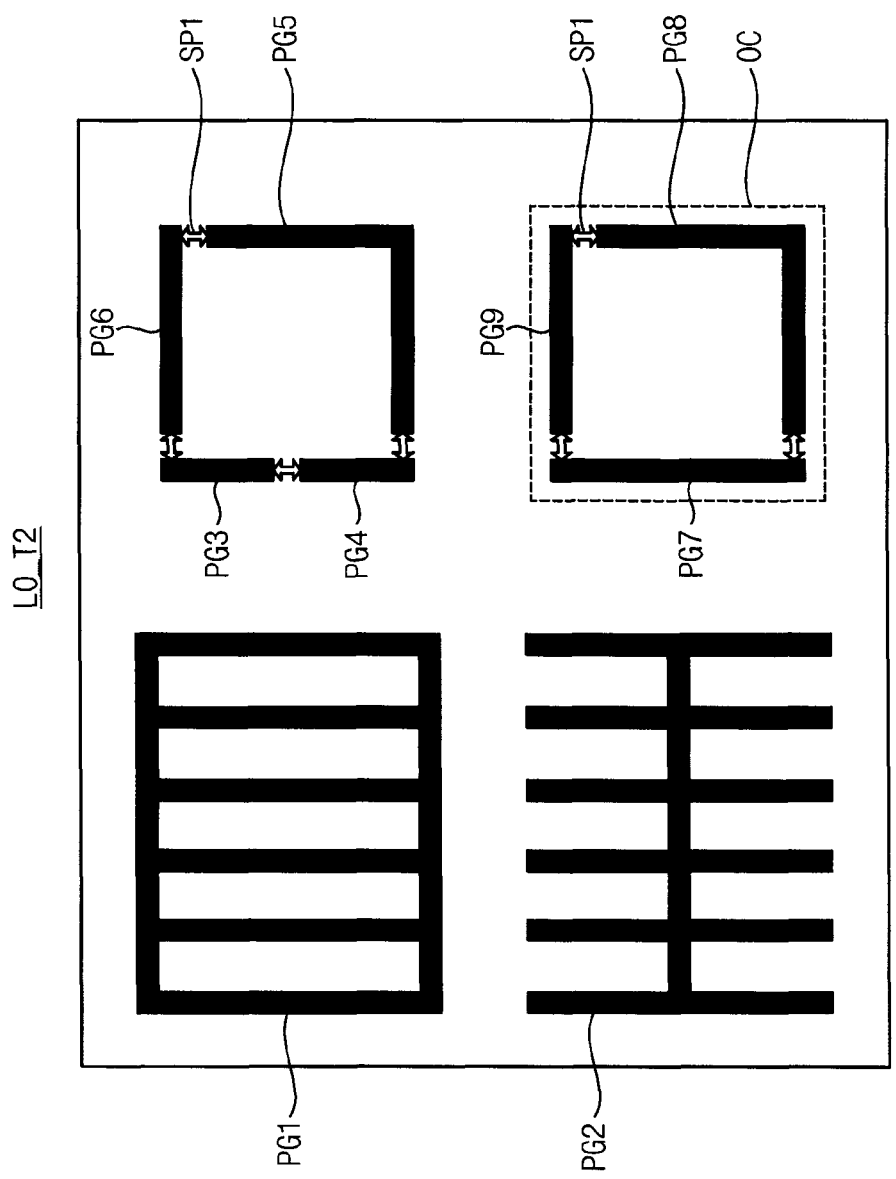
FIG. 15 is a diagram illustrating an example of a second temporary layout generated by inserting a first separator on the layout of FIG. 13.
Figure 16:
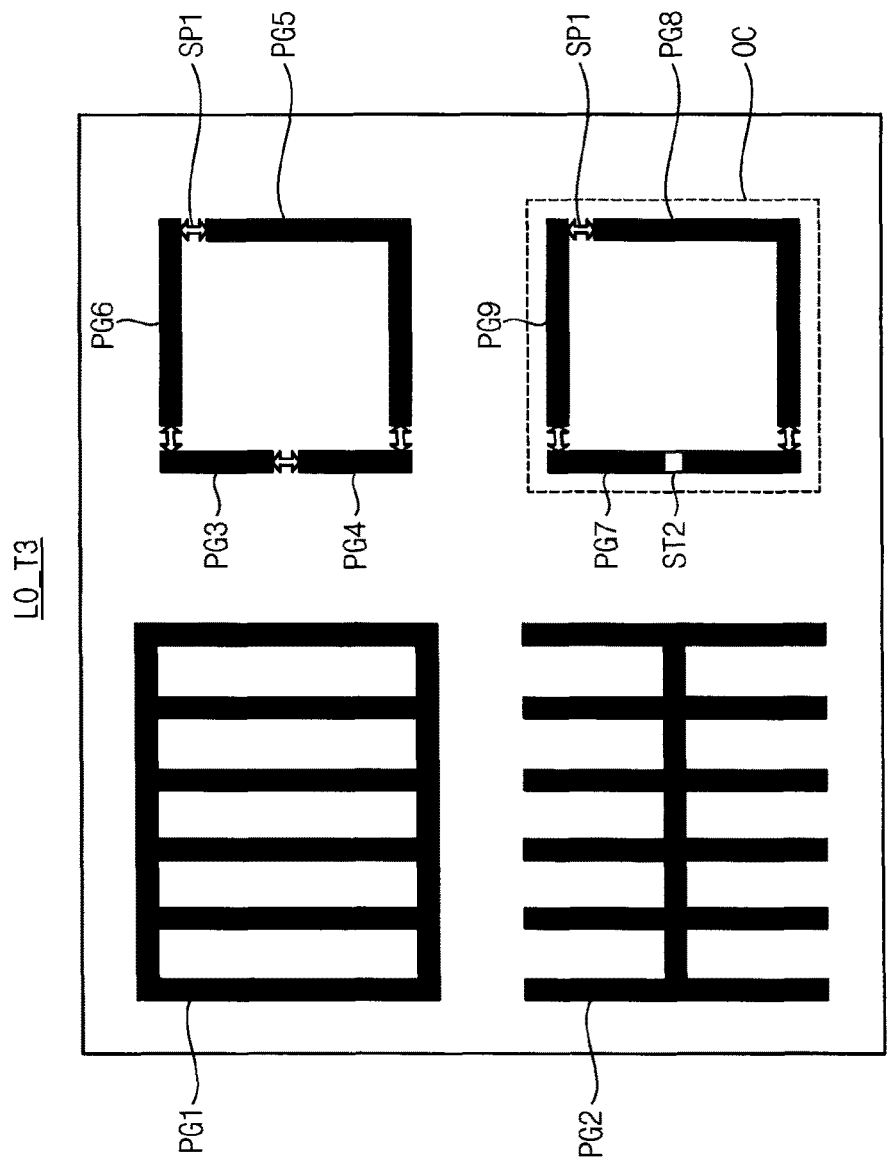
FIG. 16 is a diagram illustrating an example of a third temporary layout generated by inserting a second stitch on the second temporary layout of FIG. 15.

FIG. 13 is a diagram illustrating an example of a layout of a semiconductor device provided to the layout decomposition device of FIG. 12. FIG. 14 is a diagram illustrating an example of a first temporary layout generated by inserting a first stitch on the layout of FIG. 13. FIG. 15 is a diagram illustrating an example of a second temporary layout generated by inserting a first separator on the layout of FIG. 13. FIG. 16 is a diagram illustrating an example of a third temporary layout generated by inserting a second stitch on the second temporary layout of FIG. 15.

Referring to FIG. 13, the layout LO of the semiconductor device may include first through ninth polygons PG1, PG2, PG3, PG4, PG5, PG6, PG7, PG8 and PG9.

Among the first through ninth polygons PG1, PG2, PG3, PG4, PG5, PG6, PG7, PG8 and PG9 included in the layout LO, each of the first polygon PG1 and the second polygon PG2 includes a plurality of intersections IS at each of which at least two lines are crossed, and each of the third through ninth polygons PG3, PG4, PG5, PG6, PG7, PG8 and PG9 includes equal to or smaller than one intersection IS. Therefore, the first stitch generator 110 may determine each of the first polygon PG1 and the second polygon PG2 as the complex polygon.

Therefore, as illustrated in FIG. 14, the first stitch generator 110 may generate the first temporary layout LO_T1 by inserting the first stitch ST1 between the plurality of intersections IS on each of the first polygon PG1 and the second polygon PG2.

In the layout LO of FIG. 13, a distance between two adjacent polygons among the third through sixth polygons PG3, PG4, PG5 and PG6 may be smaller than the critical dimension. Similarly, a distance between two adjacent polygons among the seventh through ninth polygons PG7, PG8 and PG9 may be smaller than the critical dimension.

Therefore, as illustrated in FIG. 15, the first separator generator 120 may generate the second temporary layout LO_T2 by inserting the first separator SP1 between two polygons, which are within the critical dimension from each other, among the first through ninth polygons PG1, PG2, PG3, PG4, PG5, PG6, PG7, PG8 and PG9 included in the layout LO.

Referring to FIG. 15, the third through sixth polygons PG3, PG4, PG5 and PG6 may form an even cycle in which even numbers of the polygons are circularly connected by the first separators SP1. However, the seventh through ninth polygons PG7, PG8 and PG9 may form an odd cycle OC in which odd numbers of the polygons are circularly connected by the first separators SP1.

Therefore, as illustrated in FIG. 16, the second stitch generator 130 may generate the third temporary layout LO_T3 by inserting the second stitch ST2 one of the odd numbers of the polygons PG7, PG8 and PG9 included in the odd cycle OC that is formed in the second temporary layout LO_T2. In FIG. 16, the second stitch ST2 is inserted on the seventh polygon PG7 as an example.

Referring again to FIG. 12, the controller 200 may receive the first temporary layout LO_T1 from the first stitch generator 110 and receive the third temporary layout LO_T3 from the second stitch generator 130. The controller 200 may combine the first temporary layout LO_T1 and the third temporary layout LO_T3 to generate a target pattern TP.

Figure 17:
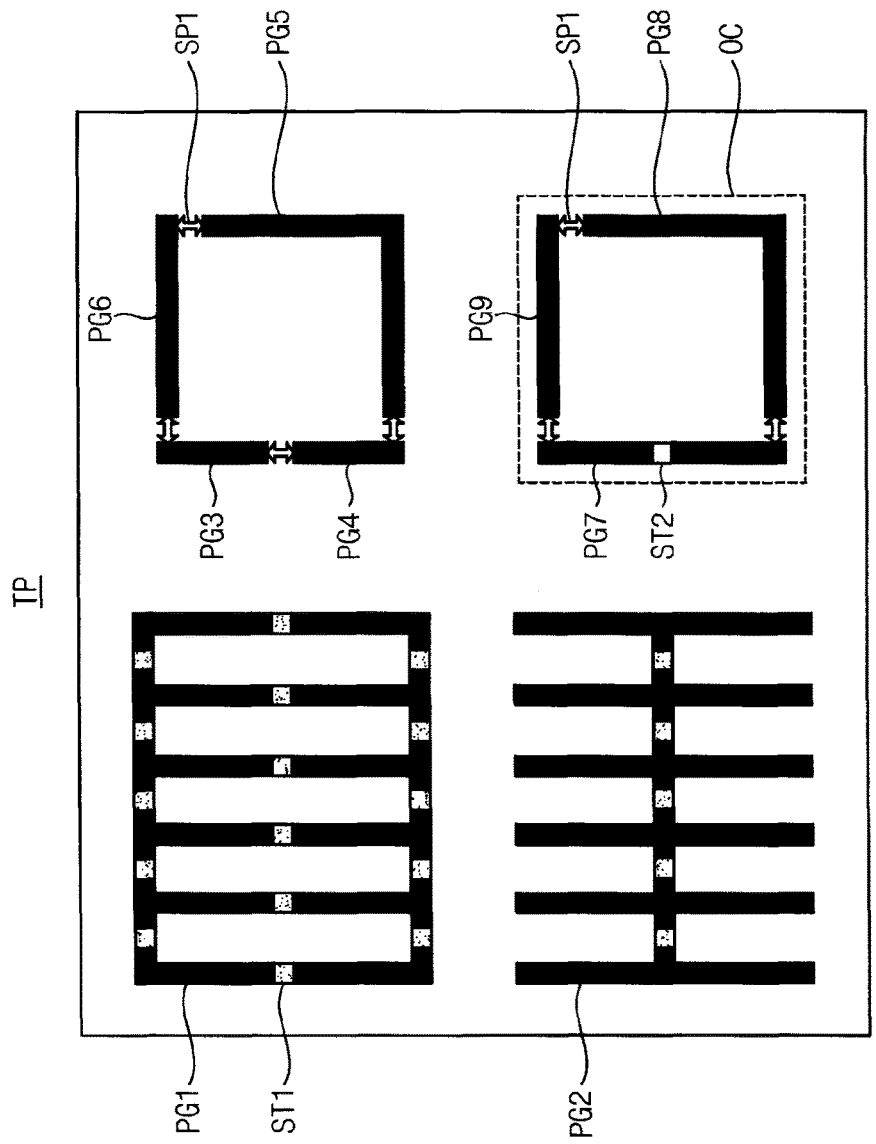
FIG. 17 is a diagram illustrating an example of a target pattern generated by combining the first temporary layout of FIG. 14 and the third temporary layout of FIG. 16.

FIG. 17 is a diagram illustrating an example of a target pattern generated by combining the first temporary layout of FIG. 14 and the third temporary layout of FIG. 16.

As illustrated in FIG. 17, the controller 200 may generate the target pattern TP that includes the first stitch ST1, which is included in the first temporary layout LO_T1, and the first separator SP1 and the second stitch ST2, which are included in the third temporary layout LO_T3.

The controller 200 may provide the target pattern TP to the pattern decomposition device 300.

The pattern decomposition device 300 may generate a plurality of decomposed patterns DCPs by performing the pattern dividing operation on the target pattern TP (step S400).

In example embodiments, the pattern decomposition device 300 may perform the pattern dividing operation using various kinds of pattern dividing algorithms.

Figure 18:
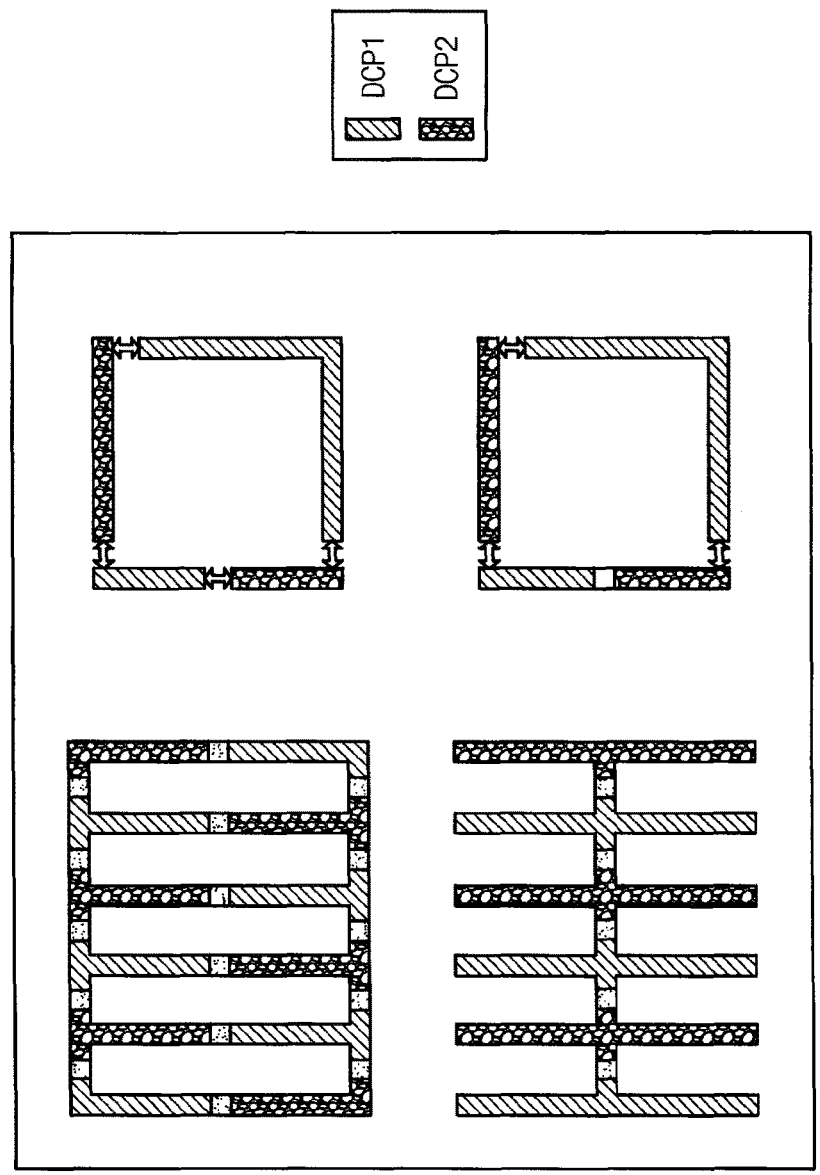
FIGS. 18, 19 and 20 are diagrams illustrating an example of a plurality of decomposed patterns generated by performing a pattern dividing operation on the target pattern of FIG. 17.
Figure 19:
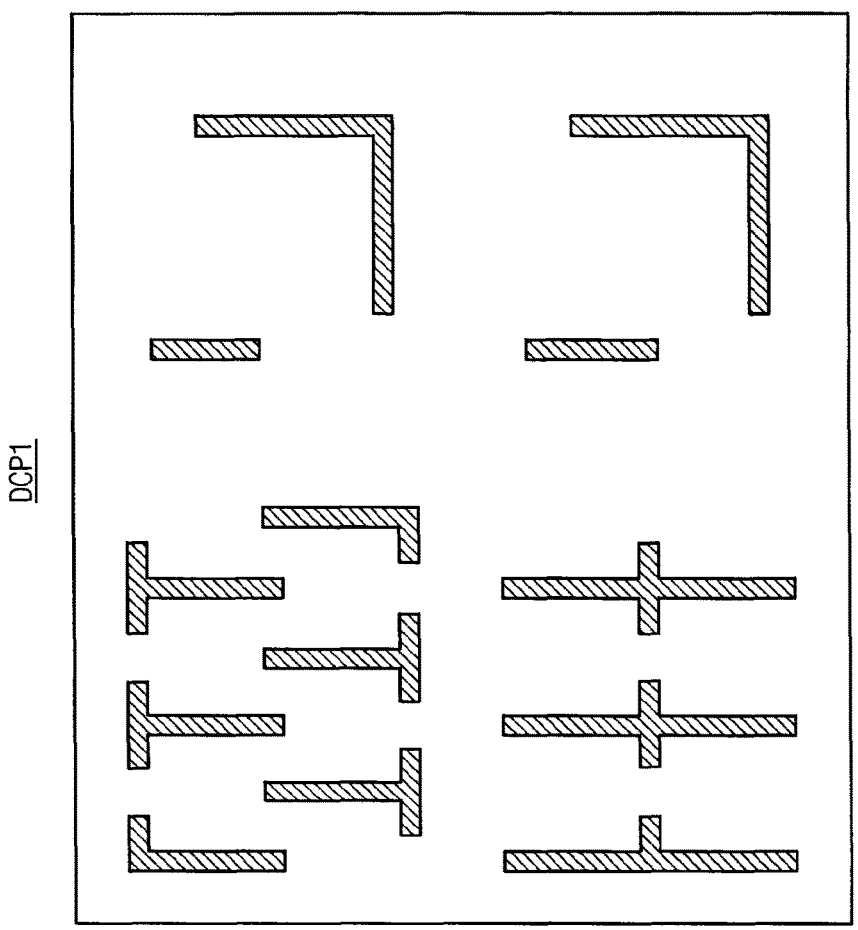
Figure 20:
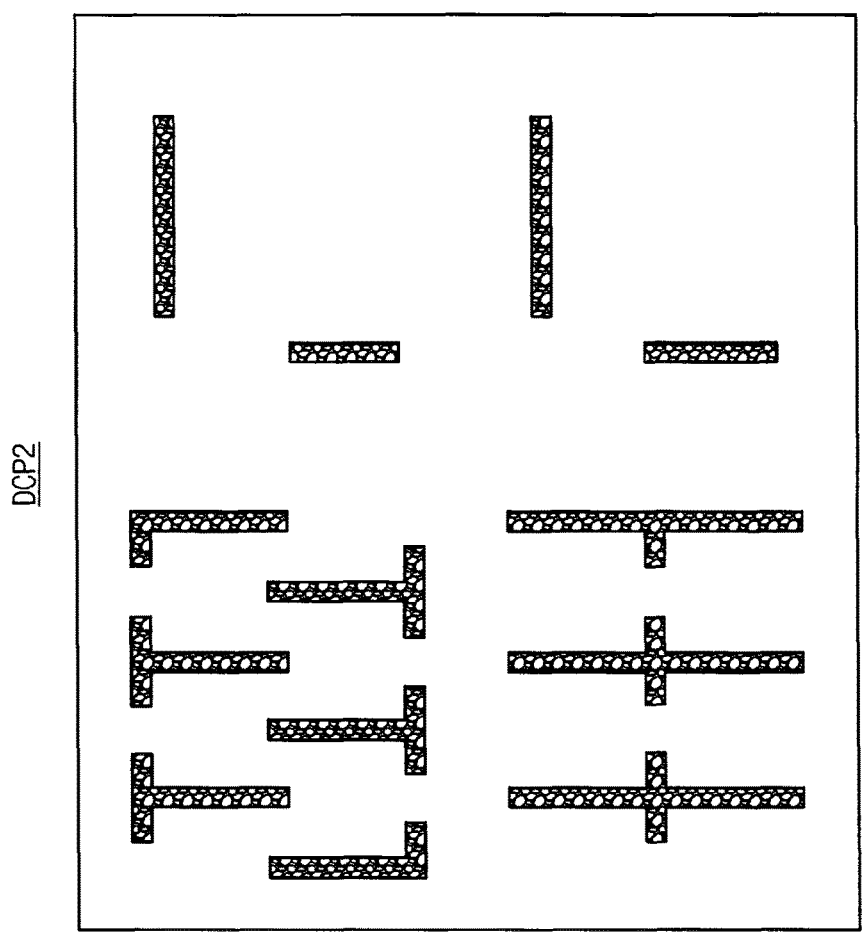

FIGS. 18, 19 and 20 are diagrams illustrating an example of a plurality of decomposed patterns generated by performing a pattern dividing operation on the target pattern of FIG. 17.

FIG. 18 represents a result of the pattern dividing operation performed on the target pattern TP of FIG. 17 by the pattern decomposition device 300 using the double pattern dividing algorithm, which is used in the DPT process, to generate a first decomposed pattern DCP1 and a second decomposed pattern DCP2. FIGS. 19 and 20 represent the first decomposed pattern DCP1 and the second decomposed pattern DCP2 separately.

As illustrated in FIGS. 18, 19 and 20, the pattern decomposition device 300 may generate the first decomposed pattern DCP1 and the second decomposed pattern DCP2 based on the first stitch ST1, the first separator SP1 and the second stitch ST2 included in the target pattern TP. For example, the pattern decomposition device 300 may separate a first part of the complex polygon, which is on one side of the first stitch ST1, and a second part of the complex polygon, which is on the other side of the first stitch ST1, into the first decomposed pattern DCP1 and the second decomposed pattern DCP2, respectively, for each of the complex polygons PG1 and PG2 including the first stitch ST1, separate two polygons, which are located at both sides of the first separator SP1, into the first decomposed pattern DCP1 and the second decomposed pattern DCP2, respectively, and separate a first part of the polygon PG7 including the second stitch ST2, which is on one side of the second stitch ST2, and a second part of the polygon PG7 including the second stitch ST2, which is on the other side of the second stitch ST2, into the first decomposed pattern DCP1 and the second decomposed pattern DCP2, respectively. In example embodiments, an area on which the first stitch ST1 or the second stitch ST2 is located may be included in both the first decomposed pattern DCP1 and the second decomposed pattern DCP2.

As described above with reference to FIGS. 1 to 20, in the method of decomposing a layout of a semiconductor device according to example embodiments, the pattern dividing operation is performed on the layout LO to generate the plurality of decomposed patterns DCPs after the first stitch ST1 is inserted between the plurality of intersections IS on the complex polygon, the first separator SP1 is inserted between two polygons, which are within the critical dimension from each other, and the second stitch ST2 is inserted on one of the odd numbers of the polygons included in the odd cycle OC. Therefore, a difference between pattern densities of the first decomposed pattern DCP1 and the second decomposed pattern DCP2 may effectively decrease. As such, when the semiconductor device is manufactured based on the plurality of decomposed patterns DCPs, a critical dimension uniformity may increase and a loading effect may decrease while limiting and/or preventing an occurrence of a bridge in which adjacent patterns are connected together.

Figure 21:
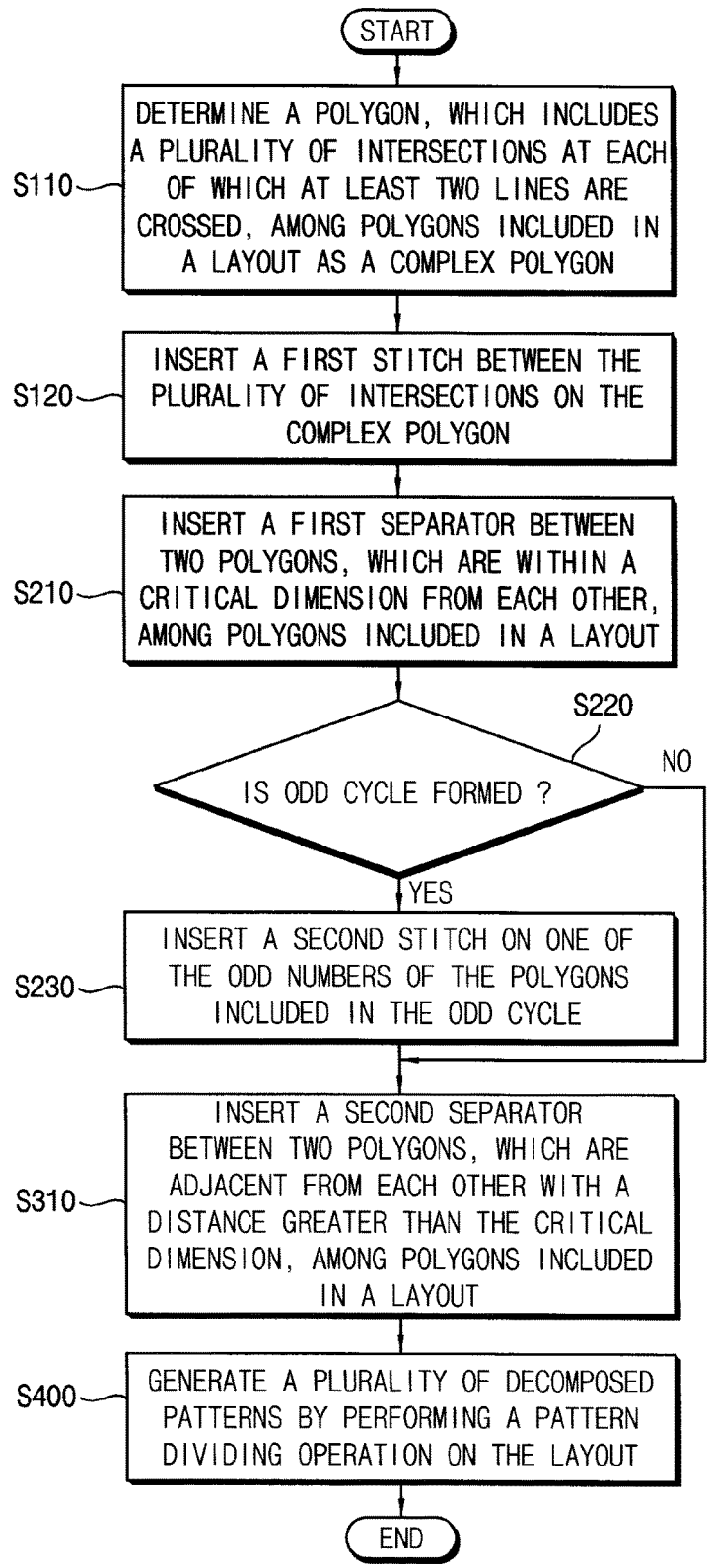
FIG. 21 is a flow chart illustrating a method of decomposing a layout of a semiconductor device according to example embodiments.

FIG. 21 is a flow chart illustrating a method of decomposing a layout of a semiconductor device according to example embodiments.

The method of decomposing a layout of a semiconductor device of FIG. 21 further includes a step S310 from the method of decomposing a layout of a semiconductor device of FIG. 11. Therefore, duplicate descriptions will be omitted here.

When receiving the layout of the semiconductor device, a second separator is inserted between two polygons, which are adjacent from each other with a distance greater than the critical dimension, among the polygons included in the layout (step S310).

While performing the pattern dividing operation, the second separator may represent a restriction that the two polygons, which are located at both sides of the second separator, are separated into different decomposed patterns from each other among the plurality of decomposed patterns.

After that, a plurality of decomposed patterns are generated by performing the pattern dividing operation on the layout including the first separator, the second separator, the first stitch and the second stitch (step S400).

By performing the pattern dividing operation, a first part of the complex polygon, which is on one side of the first stitch, and a second part of the complex polygon, which is on the other side of the first stitch, may be separated into different decomposed patterns from each other among the plurality of decomposed patterns, the two polygons, which are located at both sides of the first separator, may be separated into different decomposed patterns from each other among the plurality of decomposed patterns, a first part of a polygon including the second stitch, which is on one side of the second stitch, and a second part of the polygon including the second stitch, which is on the other side of the second stitch, may be separated into different decomposed patterns from each other among the plurality of decomposed patterns, and the two polygons, which are located at both sides of the second separator, may be separated into different decomposed patterns from each other among the plurality of decomposed patterns.

Figure 22:
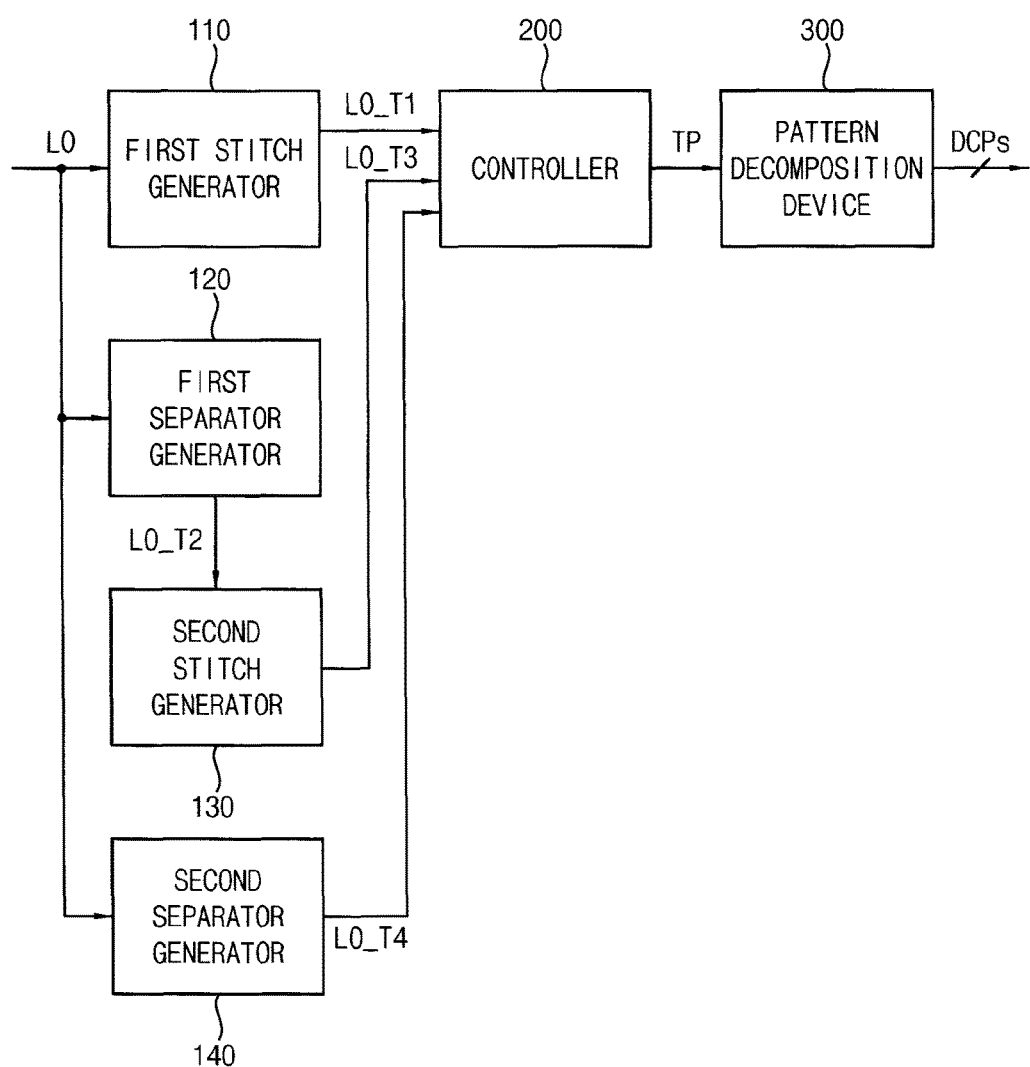
FIG. 22 is a block diagram illustrating a layout decomposition device according to example embodiments.

FIG. 22 is a block diagram illustrating a layout decomposition device according to example embodiments.

The method of decomposing a layout of a semiconductor device of FIG. 21 may be performed by a layout decomposition device 30 of FIG. 22.

The layout decomposition device 30 of FIG. 22 further includes a second separator generator 140 from the layout decomposition device 20 of FIG. 12.

Hereinafter, the method of decomposing a layout of a semiconductor device of FIG. 21 performed by the layout decomposition device 30 of FIG. 22 will be described with reference to FIGS. 1 and 22.

The first stitch generator 110, the first separator generator 120 and the second separator generator 140 receive a layout LO of a semiconductor device. The second separator generator 140 may be hardware, software, or a combination of hardware and software.

The first stitch generator 110 may determine a polygon, which includes a plurality of intersections at each of which at least two lines are crossed, among polygons included in the layout LO of the semiconductor device as a complex polygon (step S110), and insert a first stitch between the plurality of intersections on the complex polygon to generate a first temporary layout LO_T1 (step S120).

The first separator generator 120 may insert a first separator between two polygons, which are within the critical dimension from each other, among the polygons included in the layout LO to generate a second temporary layout LO_T2 (step S210).

The second stitch generator 130 may receive the second temporary layout LO_T2 from the first separator generator 120 and determine whether the odd cycle, in which odd numbers of the polygons included in the layout LO are circularly connected by the first separators, is formed in the second temporary layout LO_T2 (step S220).

When the odd cycle is not formed in the second temporary layout LO_T2 (step S220; no), the second stitch generator 130 may provide the second temporary layout LO_T2 to the controller 200 as a third temporary layout LO_T3.

When the odd cycle is formed in the second temporary layout LO_T2 (step S220; yes), the second stitch generator 130 may insert a second stitch on one of the odd numbers of the polygons included in the odd cycle to generate a third temporary layout LO_T3 (step S230), and provide the third temporary layout LO_T3 to the controller 200.

The second separator generator 140 may insert a second separator between two polygons, which are adjacent from each other with a distance greater than the critical dimension, among the polygons included in the layout LO to generate a fourth temporary layout LO_T4 (step S310).

Figure 23:
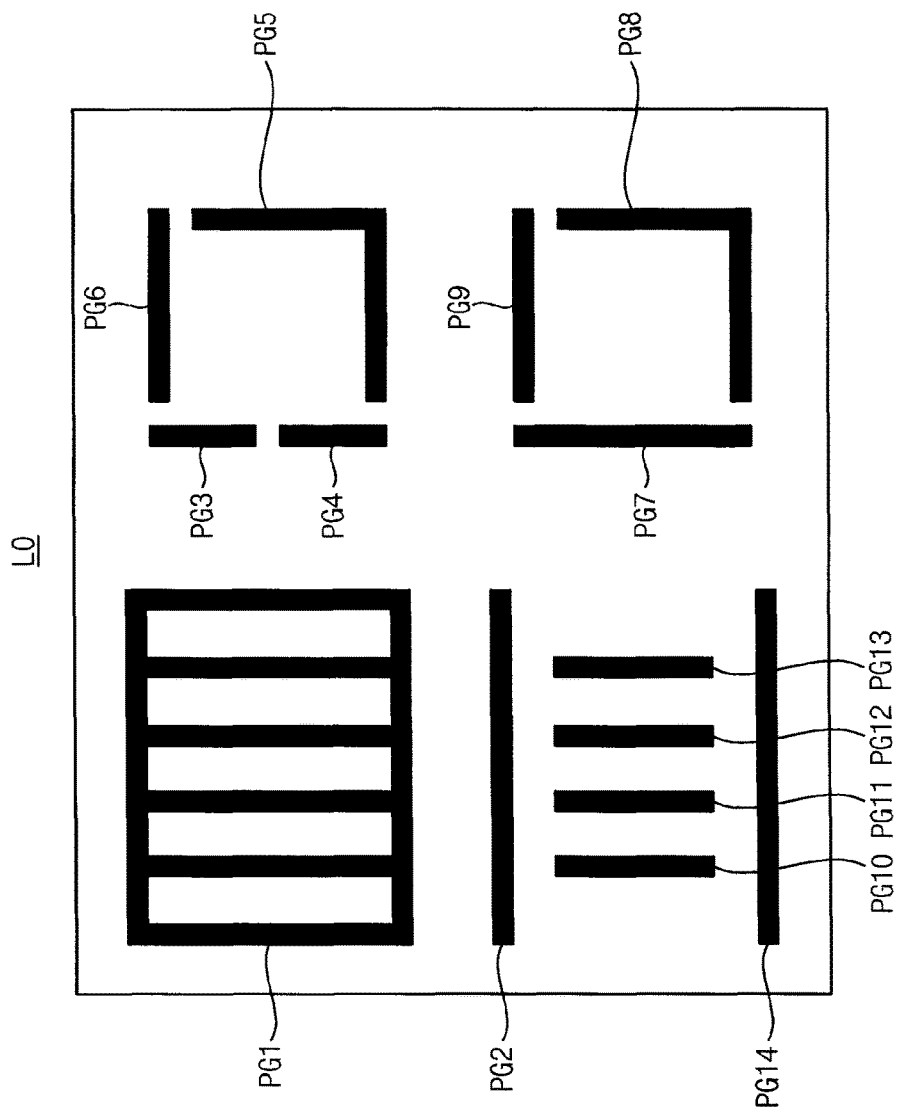
FIG. 23 is a diagram illustrating an example of a layout of a semiconductor device provided to the layout decomposition device of FIG. 22.
Figure 24:
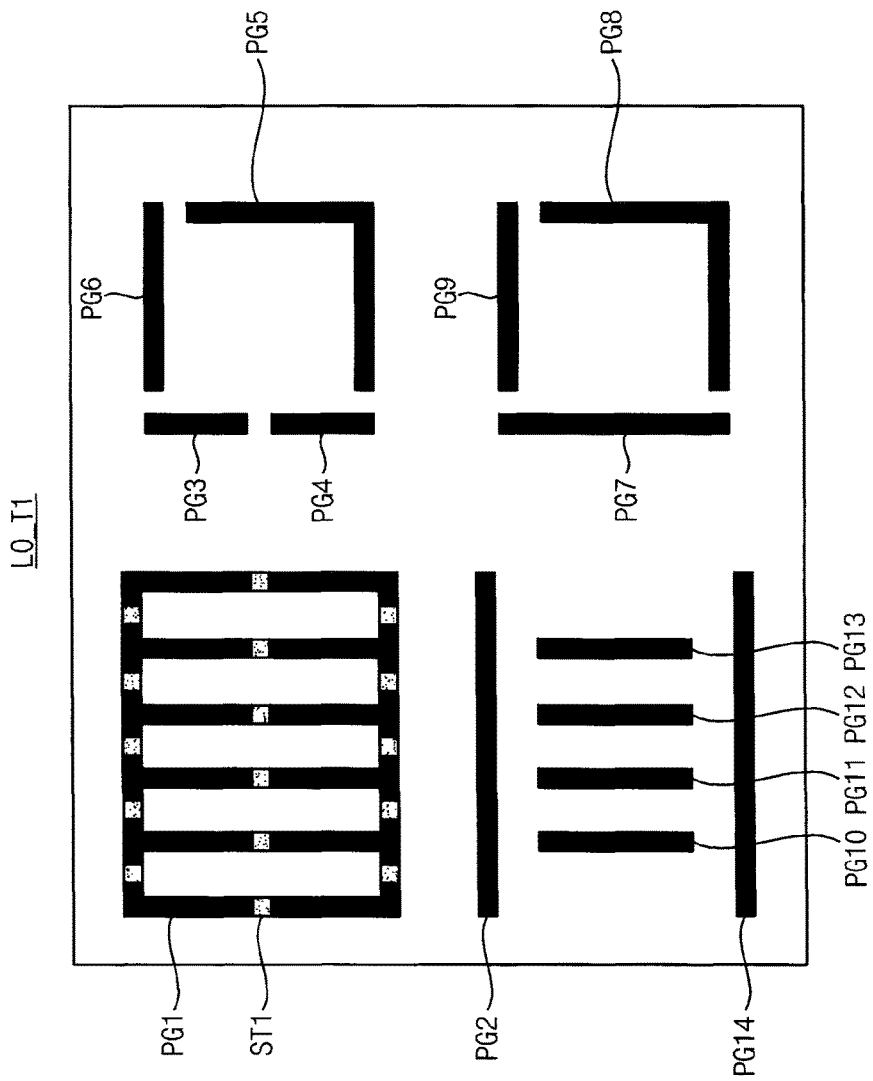
FIG. 24 is a diagram illustrating an example of a first temporary layout generated by inserting a first stitch on the layout of FIG. 23.
Figure 25:
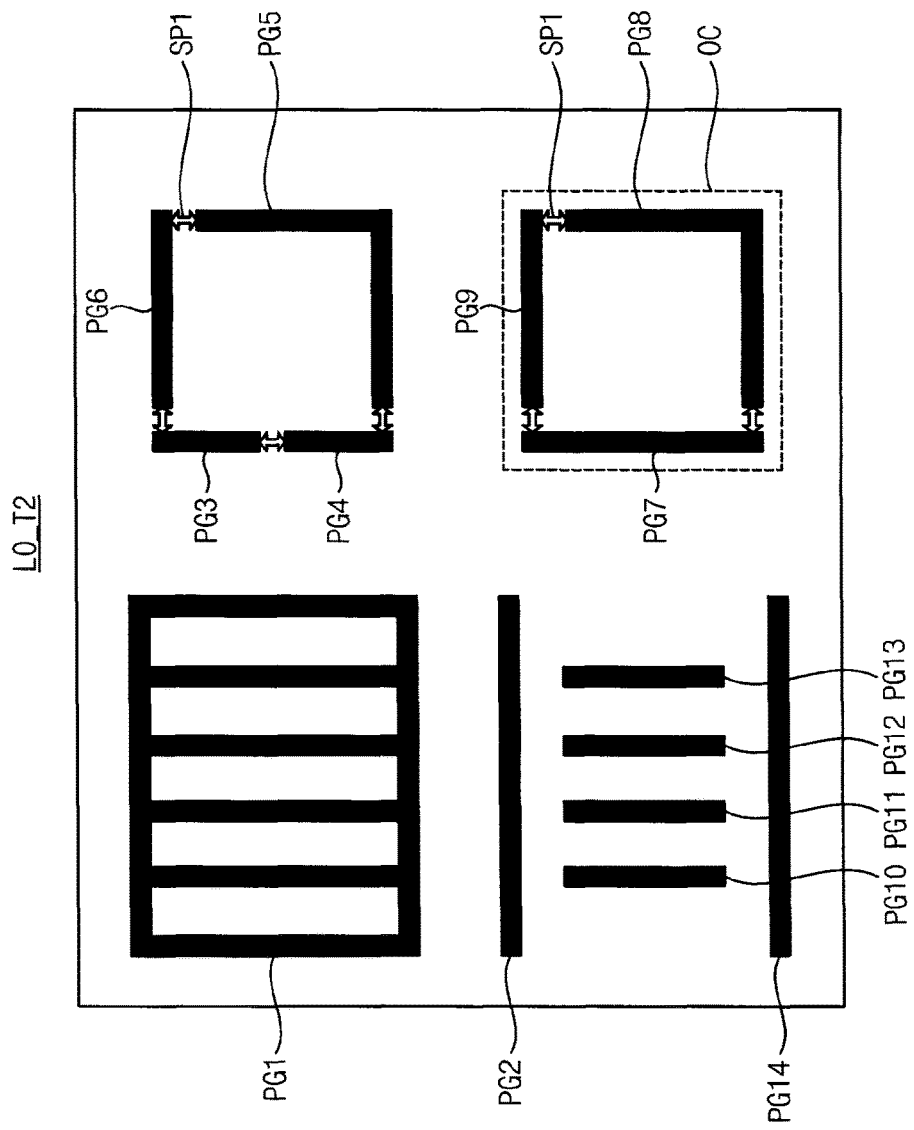
FIG. 25 is a diagram illustrating an example of a second temporary layout generated by inserting a first separator on the layout of FIG. 23.
Figure 26:
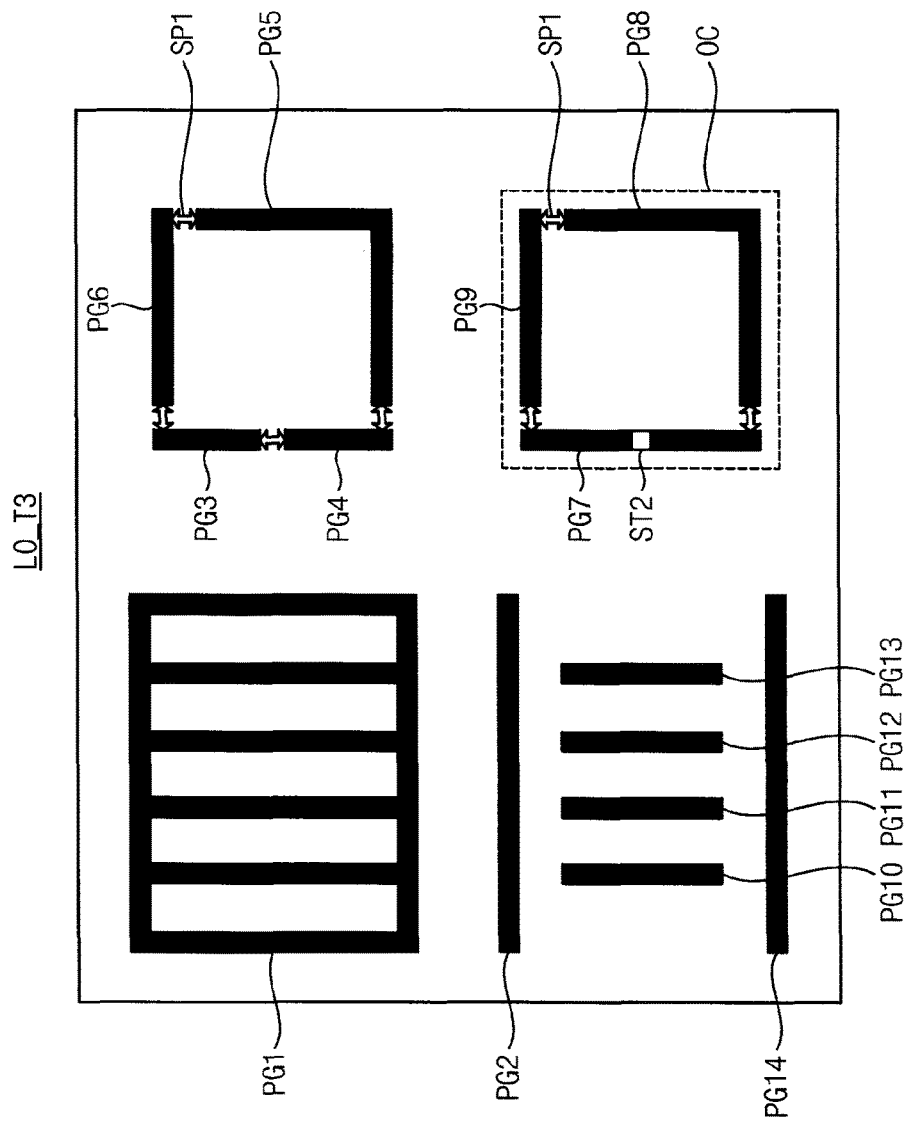
FIG. 26 is a diagram illustrating an example of a third temporary layout generated by inserting a second stitch on the second temporary layout of FIG. 25.
Figure 27:
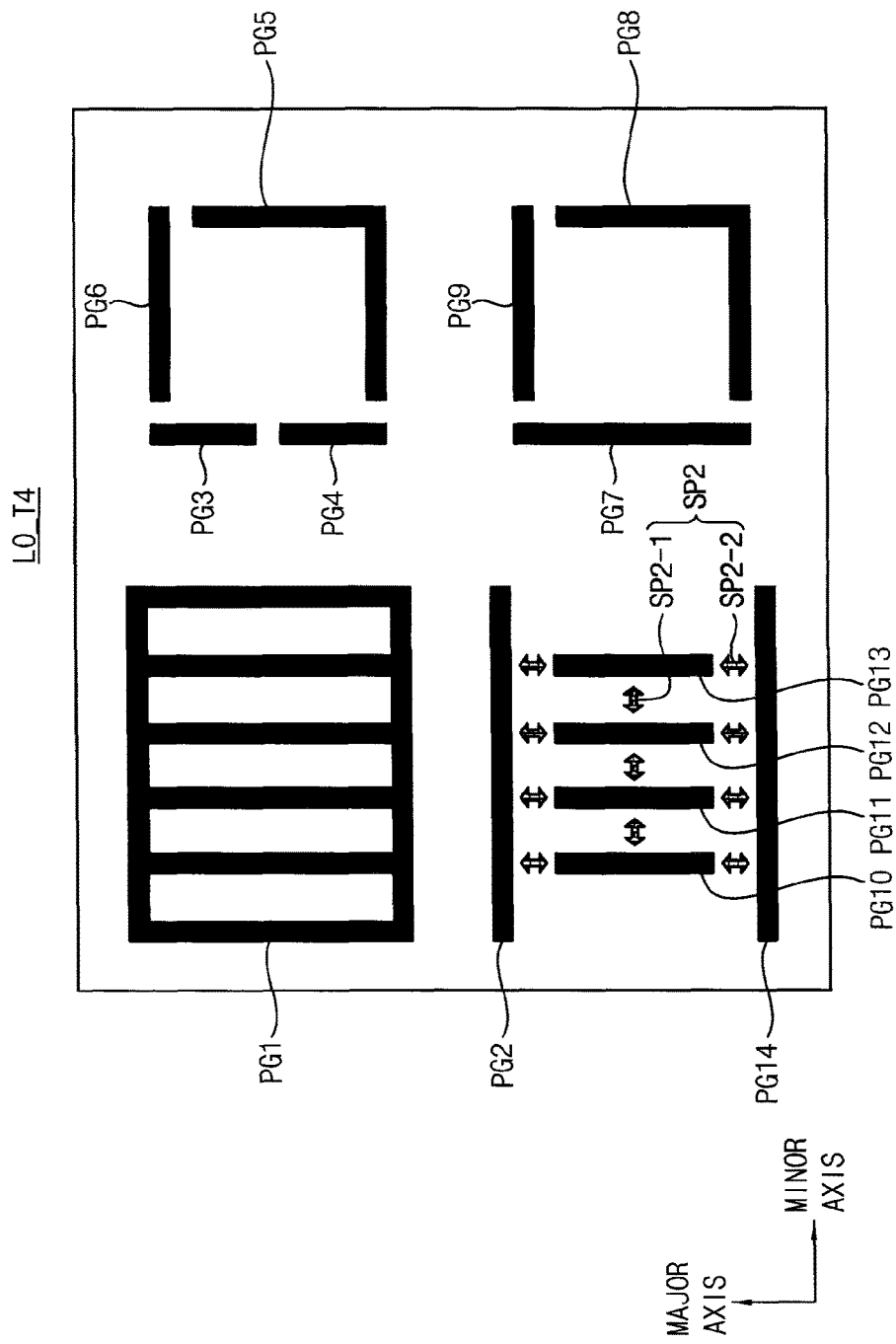
FIG. 27 is a diagram illustrating an example of a fourth temporary layout generated by inserting a second separator on the layout of FIG. 23.

FIG. 23 is a diagram illustrating an example of a layout of a semiconductor device provided to the layout decomposition device of FIG. 22. FIG. 24 is a diagram illustrating an example of a first temporary layout generated by inserting a first stitch on the layout of FIG. 23. FIG. 25 is a diagram illustrating an example of a second temporary layout generated by inserting a first separator on the layout of FIG. 23. FIG. 26 is a diagram illustrating an example of a third temporary layout generated by inserting a second stitch on the second temporary layout of FIG. 25. FIG. 27 is a diagram illustrating an example of a fourth temporary layout generated by inserting a second separator on the layout of FIG. 23.

Referring to FIG. 23, the layout LO of the semiconductor device may include first through fourteenth polygons PG1, PG2, PG3, PG4, PG5, PG6, PG7, PG8, PG9, PG10, PG11, PG12, PG13 and PG14.

Among the first through fourteenth polygons PG1, PG2, PG3, PG4, PG5, PG6, PG7, PG8, PG9, PG10, PG11, PG12, PG13 and PG14 included in the layout LO, the first polygon PG1 includes a plurality of intersections IS at each of which at least two lines are crossed, and each of the second through fourteenth polygons PG2, PG3, PG4, PG5, PG6, PG7, PG8, PG9, PG10, PG11, PG12, PG13 and PG14 includes equal to or smaller than one intersection IS. Therefore, the first stitch generator 110 may determine the first polygon PG1 as the complex polygon.

Therefore, as illustrated in FIG. 24, the first stitch generator 110 may generate the first temporary layout LO_T1 by inserting the first stitch ST1 between the plurality of intersections IS on the first polygon PG1.

In the layout LO of FIG. 23, a distance between two adjacent polygons among the third through sixth polygons PG3, PG4, PG5 and PG6 may be smaller than the critical dimension. Similarly, a distance between two adjacent polygons among the seventh through ninth polygons PG7, PG8 and PG9 may be smaller than the critical dimension.

Therefore, as illustrated in FIG. 25, the first separator generator 120 may generate the second temporary layout LO_T2 by inserting the first separator SP1 between two polygons, which are within the critical dimension from each other, among the first through fourteenth polygons PG1, PG2, PG3, PG4, PG5, PG6, PG7, PG8, PG9, PG10, PG11, PG12, PG13 and PG14 included in the layout LO.

Referring to FIG. 25, the third through sixth polygons PG3, PG4, PG5 and PG6 may form an even cycle in which even numbers of the polygons are circularly connected by the first separators SP1. However, the seventh through ninth polygons PG7, PG8 and PG9 may form an odd cycle OC in which odd numbers of the polygons are circularly connected by the first separators SP1.

Therefore, as illustrated in FIG. 26, the second stitch generator 130 may generate the third temporary layout LO_T3 by inserting the second stitch ST2 in one of the odd numbers of the polygons PG7, PG8 and PG9 included in the odd cycle OC that is formed in the second temporary layout LO_T2. In FIG. 26, the second stitch ST2 is inserted on the seventh polygon PG7 as an example.

In the layout LO of FIG. 23, a distance between two adjacent polygons among the second and tenth through fourteenth polygons PG2, PG10, PG11, PG12, PG13 and PG14 may be greater than the critical dimension.

Therefore, as illustrated in FIG. 27, the second separator generator 140 may generate the fourth temporary layout LO_T4 by inserting the second separator SP2 between two polygons, which are adjacent from each other with a distance greater than the critical dimension, among the first through fourteenth polygons PG1, PG2, PG3, PG4, PG5, PG6, PG7, PG8, PG9, PG10, PG11, PG12, PG13 and PG14 included in the layout LO.

In example embodiments, a certain polygon (e.g., one of the tenth through thirteenth polygons PG10, PG11, PG12 and PG13 in FIG. 27) may have a first neighboring polygon, which is apart from the certain polygon more than the critical dimension in a direction corresponding to a minor axis of the certain polygon (that is, a width direction of the certain polygon) and a second neighboring polygon, which is apart from the certain polygon more than the critical dimension in a direction corresponding to a major axis of the certain polygon (that is, a longitudinal direction of the certain polygon). In this case, the second separator SP2-1, which is inserted between the certain polygon and the first neighboring polygon that is apart from the certain polygon more than the critical dimension in the direction corresponding to the minor axis of the certain polygon, may have a first priority while performing the pattern dividing operation, and the second separator SP2-2, which is inserted between the certain polygon and the second neighboring polygon that is apart from the certain polygon more than the critical dimension in the direction corresponding to the major axis of the certain polygon, may have a second priority, which is lower than the first priority, while performing the pattern dividing operation.

Referring again to FIG. 22, the controller 200 may receive the first temporary layout LO_T1 from the first stitch generator 110, receive the third temporary layout LO_T3 from the second stitch generator 130 and receive the fourth temporary layout LO_T4 from the second stitch generator 140. The controller 200 may combine the first temporary layout LO_T1, the third temporary layout LO_T3 and the fourth temporary layout LO_T4 to generate a target pattern TP.

Figure 28:
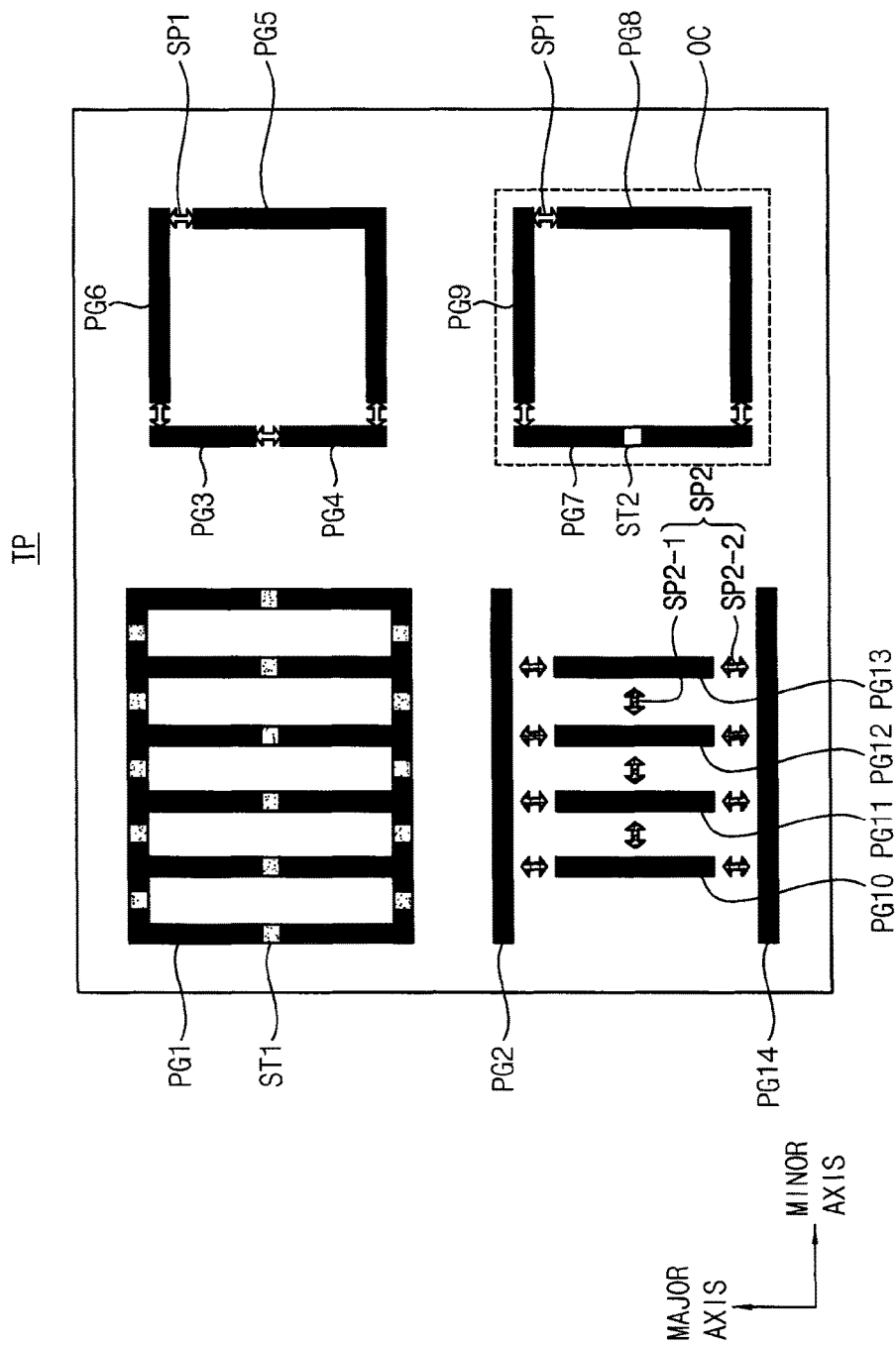
FIG. 28 is a diagram illustrating an example of a target pattern generated by combining the first temporary layout of FIG. 24, the third temporary layout of FIG. 26 and the fourth temporary layout of FIG. 27.

FIG. 28 is a diagram illustrating an example of a target pattern generated by combining the first temporary layout of FIG. 24, the third temporary layout of FIG. 26 and the fourth temporary layout of FIG. 27.

As illustrated in FIG. 28, the controller 200 may generate the target pattern TP that includes the first stitch ST1, which is included in the first temporary layout LO_T1, the first separator SP1 and the second stitch ST2, which are included in the third temporary layout LO_T3, and the second separator SP2, which is included in the fourth temporary layout LO_T4.

The controller 200 may provide the target pattern TP to the pattern decomposition device 300.

The pattern decomposition device 300 may generate a plurality of decomposed patterns DCPs by performing the pattern dividing operation on the target pattern TP (step S400).

As described above, the target pattern TP may include three kinds of separators, that is, the first separator SP1, the second separator SP2-1 having the first priority and the second separator SP2-2 having the second priority. Therefore, when the pattern decomposition device 300 performs the pattern dividing operation on the target pattern TP, the pattern decomposition device 300 may assign the two polygons, which are located at both sides of the first separator SP1 in the target pattern TP, to different decomposed patterns from each other among the plurality of decomposed patterns DCPs, and then assign a polygon, which is adjacent to the second separator SP2-1 having the first priority, among unassigned polygons included in the target pattern TP to one of the plurality of decomposed patterns DCPs, and then assign a polygon, which is adjacent to the second separator SP2-2 having the second priority, among unassigned polygons included in the target pattern TP to one of the plurality of decomposed patterns DCPs.

In example embodiments, the pattern decomposition device 300 may perform the pattern dividing operation using various kinds of pattern dividing algorithms.

Figure 29:
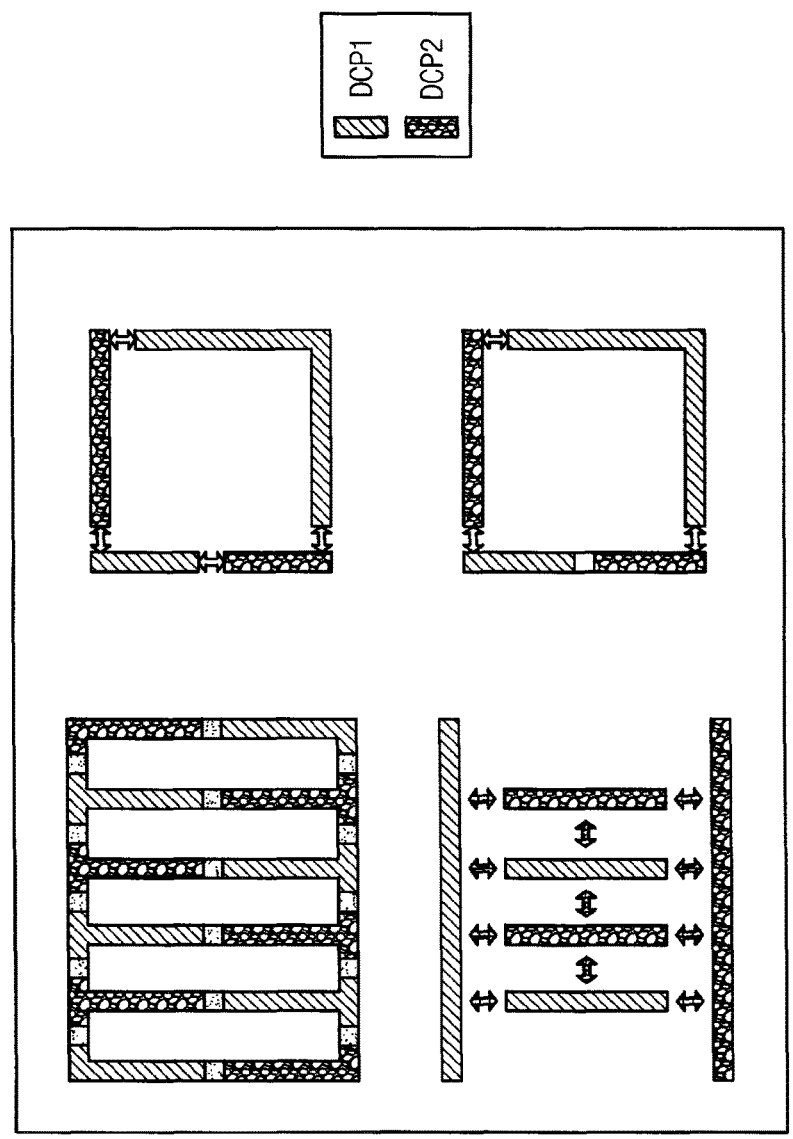
FIGS. 29, 30 and 31 are diagrams illustrating an example of a plurality of decomposed patterns generated by performing a pattern dividing operation on the target pattern of FIG. 28.
Figure 30:
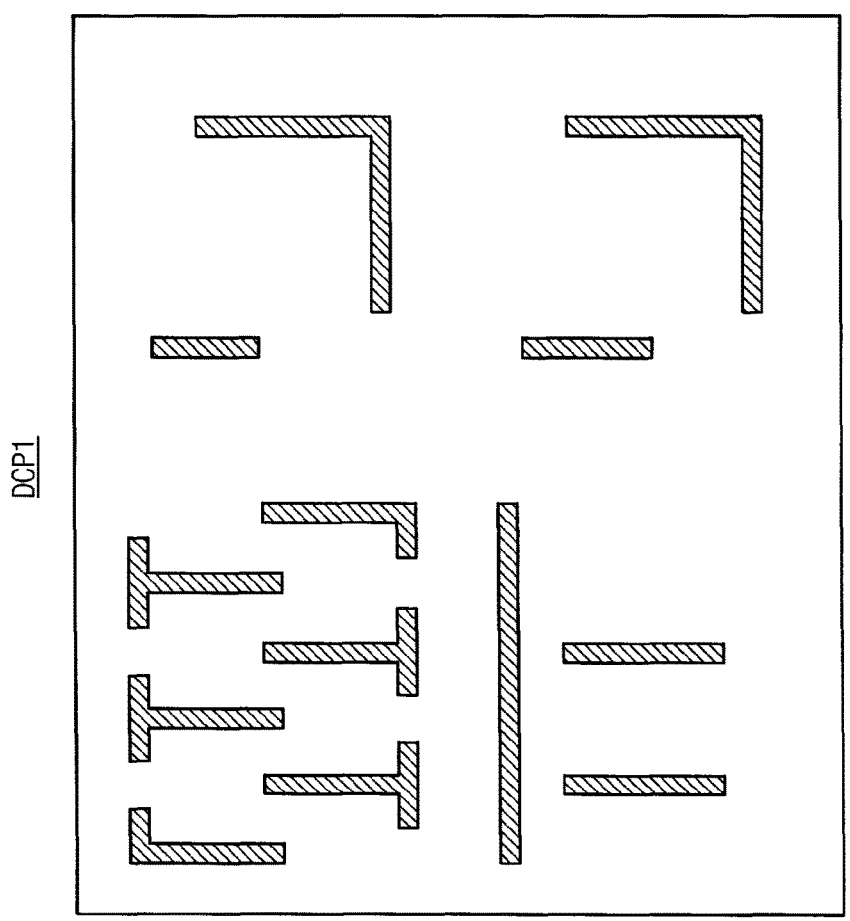
Figure 31:
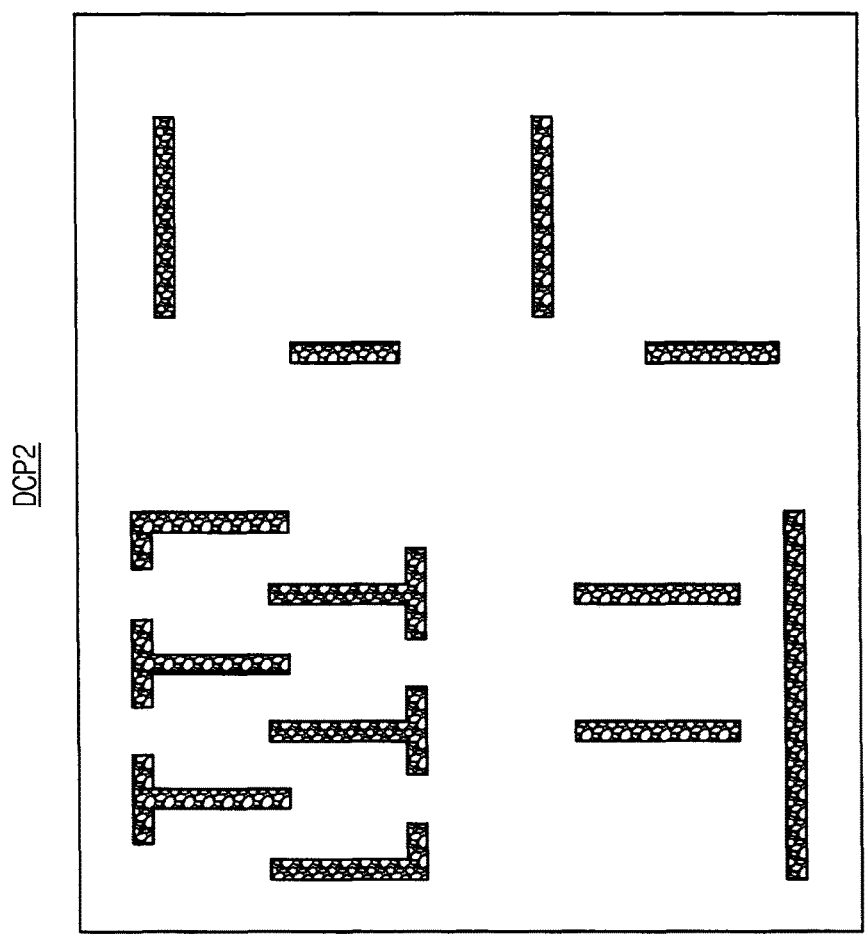

FIGS. 29, 30 and 31 are diagrams illustrating an example of a plurality of decomposed patterns generated by performing a pattern dividing operation on the target pattern of FIG. 28.

FIG. 29 represents a result of the pattern dividing operation performed on the target pattern TP of FIG. 28 by the pattern decomposition device 300 using the double pattern dividing algorithm, which is used in the DPT process, to generate a first decomposed pattern DCP1 and a second decomposed pattern DCP2. FIGS. 30 and 31 represent the first decomposed pattern DCP1 and the second decomposed pattern DCP2 separately.

As illustrated in FIGS. 29, 30 and 31, the pattern decomposition device 300 may generate the first decomposed pattern DCP1 and the second decomposed pattern DCP2 based on the first stitch ST1, the first separator SP1, the second stitch ST2 and the second separator SP2 included in the target pattern TP. For example, the pattern decomposition device 300 may separate a first part of the complex polygon, which is on one side of the first stitch ST1, and a second part of the complex polygon, which is on the other side of the first stitch ST1, into the first decomposed pattern DCP1 and the second decomposed pattern DCP2, respectively, for the complex polygon PG1 including the first stitch ST1, separate two polygons, which are located at both sides of the first separator SP1, into the first decomposed pattern DCP1 and the second decomposed pattern DCP2, respectively, and separate a first part of the polygon PG7 including the second stitch ST2, which is on one side of the second stitch ST2, and a second part of the polygon PG7 including the second stitch ST2, which is on the other side of the second stitch ST2, into the first decomposed pattern DCP1 and the second decomposed pattern DCP2, respectively.

In addition, the pattern decomposition device 300 may separate polygons PG10, PG11, PG12 and PG13, which are adjacent to the second separator SP2-1 having the first priority, among unassigned polygons PG2, PG10, PG11, PG12, PG13 and PG14 included in the target pattern TP into the first decomposed pattern DCP1 and the second decomposed pattern DCP2. After that, the pattern decomposition device 300 may separate polygons PG2 and PG14, which are adjacent to the second separator SP2-2 having the second priority, among unassigned polygons PG2 and PG14 included in the target pattern TP into the first decomposed pattern DCP1 and the second decomposed pattern DCP2.

As illustrated in FIGS. 29, 30 and 31, two polygons, which are located at both sides of the second separator SP2-2 having the second priority, may be assigned to the same decomposed pattern among the plurality of decomposed patterns DCPs. However, as described above, the second separator SP2 may be inserted between two polygons, which are adjacent from each other with a distance greater than the critical dimension. Therefore, although two polygons, which are located at both sides of the second separator SP2-2 having the second priority, are assigned to the same decomposed pattern among the plurality of decomposed patterns DCPs, a bridge, in which adjacent patterns are connected together, may not occur while manufacturing the semiconductor device based on the plurality of decomposed patterns DCPs.

If the pattern dividing operation is performed without inserting the second separator SP2 between two polygons, which are adjacent from each other with a distance greater than the critical dimension, the two polygons may be assigned to the same decomposed pattern among the plurality of decomposed patterns DCPs. In this case, a difference between pattern densities of the plurality of decomposed patterns DCPs may increase.

However, as described above, in the method of decomposing a layout of a semiconductor device of FIG. 21, the pattern dividing operation may be performed after the second separator SP2 is inserted between two polygons, which are adjacent from each other with a distance greater than the critical dimension among the polygons included in the layout LO. Therefore, polygons that are adjacent from each other with a distance greater than the critical dimension may be separated into the plurality of decomposed patterns DCPs based on the second separator SP2. As such, the difference between pattern densities of the plurality of decomposed patterns DCPs may further decrease.

Figure 32:
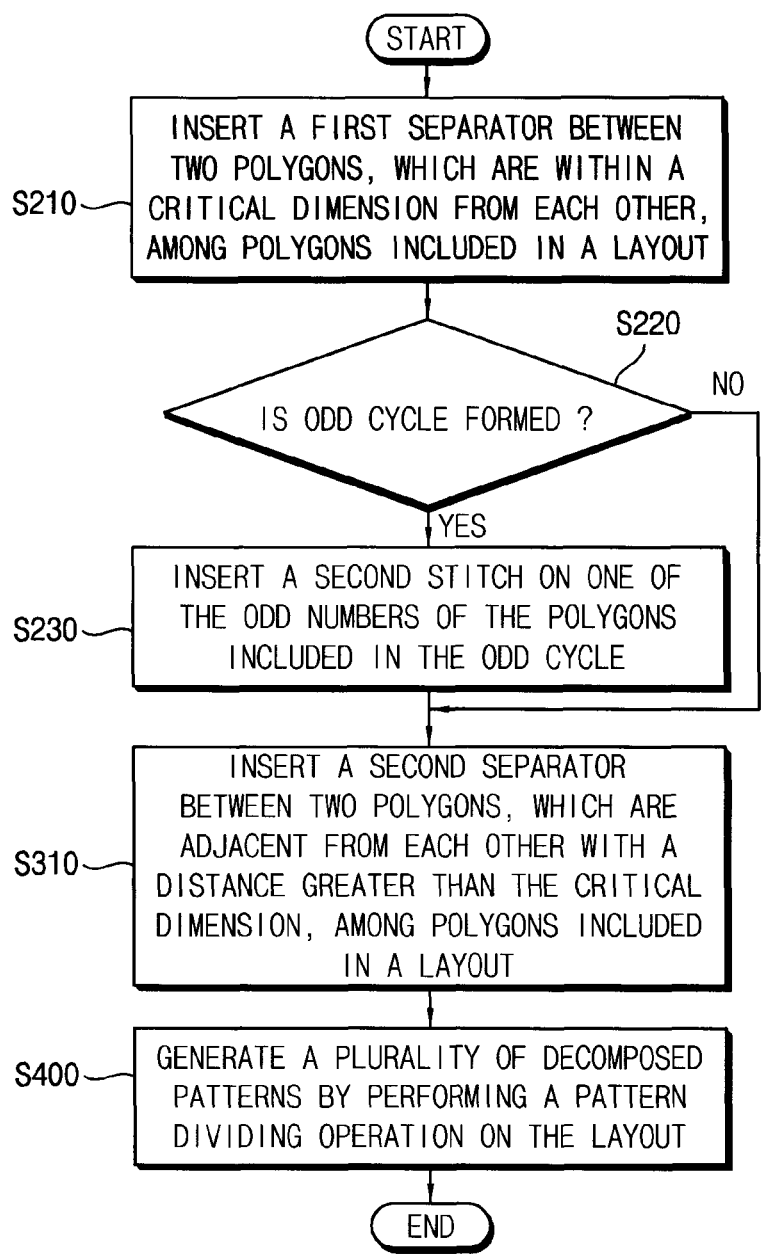
FIG. 32 is a flow chart illustrating a method of decomposing a layout of a semiconductor device according to example embodiments.

FIG. 32 is a flow chart illustrating a method of decomposing a layout of a semiconductor device according to example embodiments.

The method of decomposing a layout of a semiconductor device of FIG. 32 is the same as the method of decomposing a layout of a semiconductor device of FIG. 21 except that the method of decomposing a layout of a semiconductor device of FIG. 32 omits steps S110 and S120 from the method of decomposing a layout of a semiconductor device of FIG. 21.

Therefore, in the method of decomposing a layout of a semiconductor device of FIG. 32, the first separator, the second stitch and the second separator may be inserted on the layout while the first stitch is not inserted on the layout, and then the pattern dividing operation may be performed on the layout to generate the plurality of decomposed patterns.

The steps S210, S220, S230, S310 and S400 included in the method of FIG. 32 are the same as the steps S210, S220, S230, S310 and S400 included in the method of FIG. 21. Therefore, duplicate descriptions will be omitted here.

Figure 33:
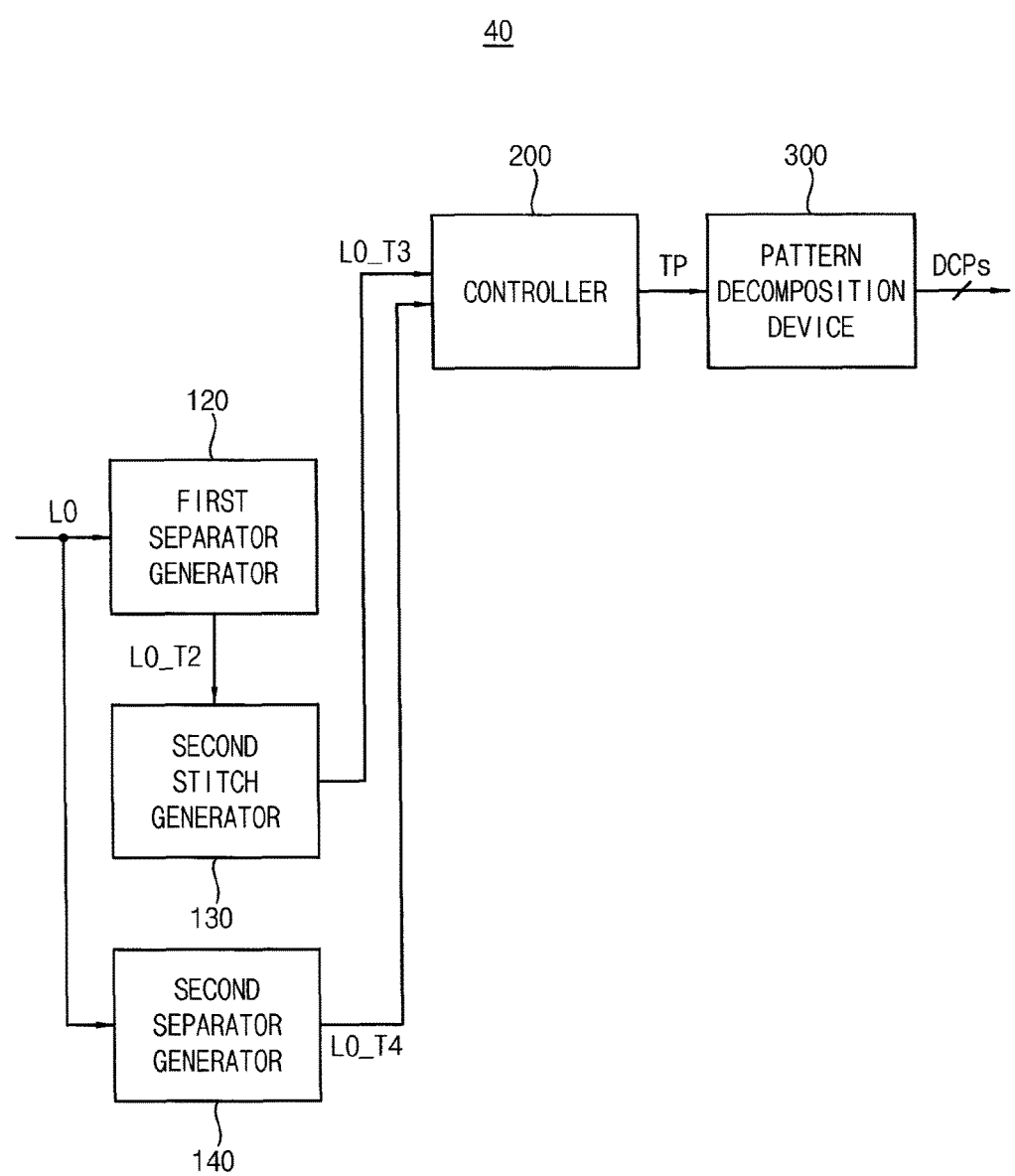
FIG. 33 is a block diagram illustrating a layout decomposition device according to example embodiments.

FIG. 33 is a block diagram illustrating a layout decomposition device according to example embodiments.

The method of decomposing a layout of a semiconductor device of FIG. 32 may be performed by a layout decomposition device 40 of FIG. 33.

The layout decomposition device 40 of FIG. 33 is the same as the layout decomposition device 30 of FIG. 22 except that the layout decomposition device 40 of FIG. 33 omits the first stitch generator 110 from the layout decomposition device 30 of FIG. 22.

Therefore, the layout decomposition device 40 of FIG. 33 may insert the first separator SP1, the second stitch ST2 and the second separator SP2 on the layout LO while not inserting the first stitch ST1 on the layout LO, and then perform the pattern dividing operation on the target pattern TP including the first separator SP1, the second stitch ST2 and the second separator SP2 to generate the plurality of decomposed patterns DCPs.

The first separator generator 120, the second stitch generator 130, the second separator generator 140, the controller 200 and the pattern decomposition device 300 included in the layout decomposition device 40 of FIG. 33 may be the same as the first separator generator 120, the second stitch generator 130, the second separator generator 140, the controller 200 and the pattern decomposition device 300 included in the layout decomposition device 30 of FIG. 22. Therefore, duplicate descriptions will be omitted here.

Figure 34:
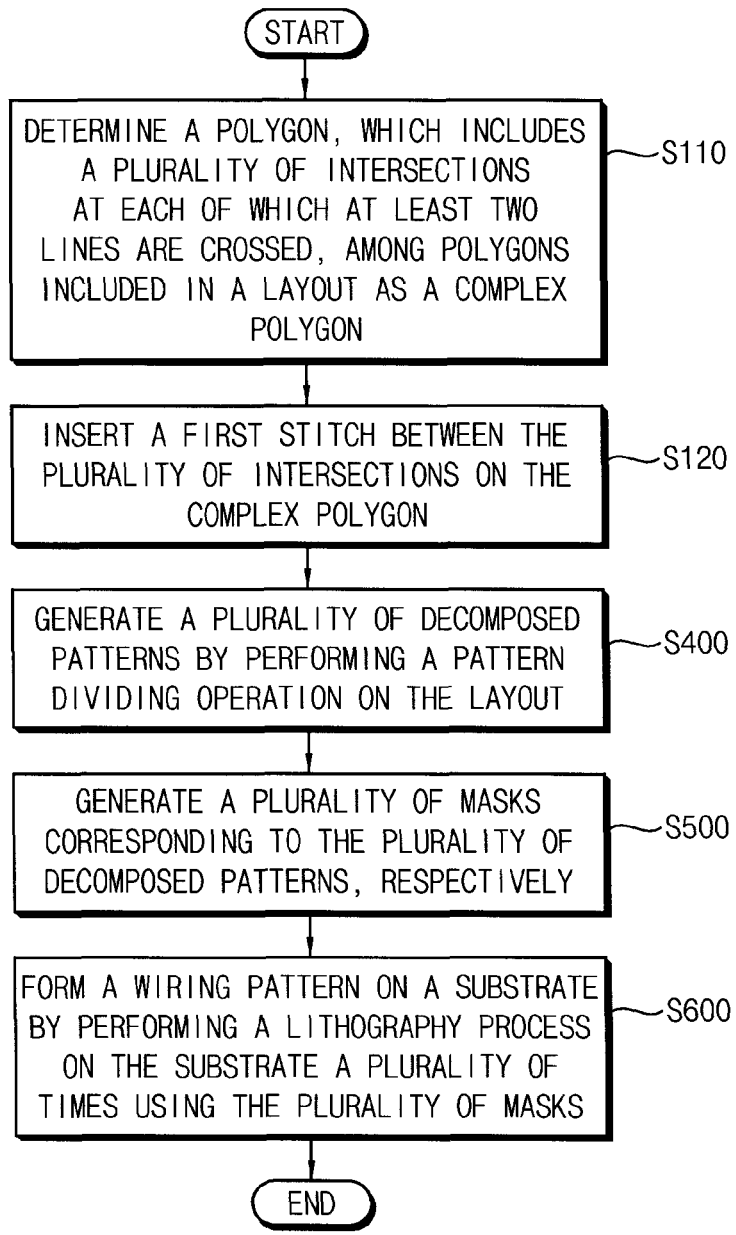
FIG. 34 is a flow chart illustrating a method of manufacturing a semiconductor device according to example embodiments.

FIG. 34 is a flow chart illustrating a method of manufacturing a semiconductor device according to example embodiments.

Referring to FIG. 34, a polygon, which includes a plurality of intersections at each of which at least two lines are crossed, among the polygons included in the layout of the semiconductor device is determined as a complex polygon (step S110), and a first stitch is inserted between the plurality of intersections on the complex polygon (step S120).

In example embodiments, the first stitch may be inserted at a center of two adjacent intersections among the plurality of intersections included in the complex polygon.

In example embodiments, the layout may include a plurality of the complex polygons. In this case, the first stitch may be inserted between the plurality of intersections on at least one of the plurality of complex polygons included in the layout.

After that, a plurality of decomposed patterns are generated by performing a pattern dividing operation on the layout including the first stitch (step S400).

Figure 35:
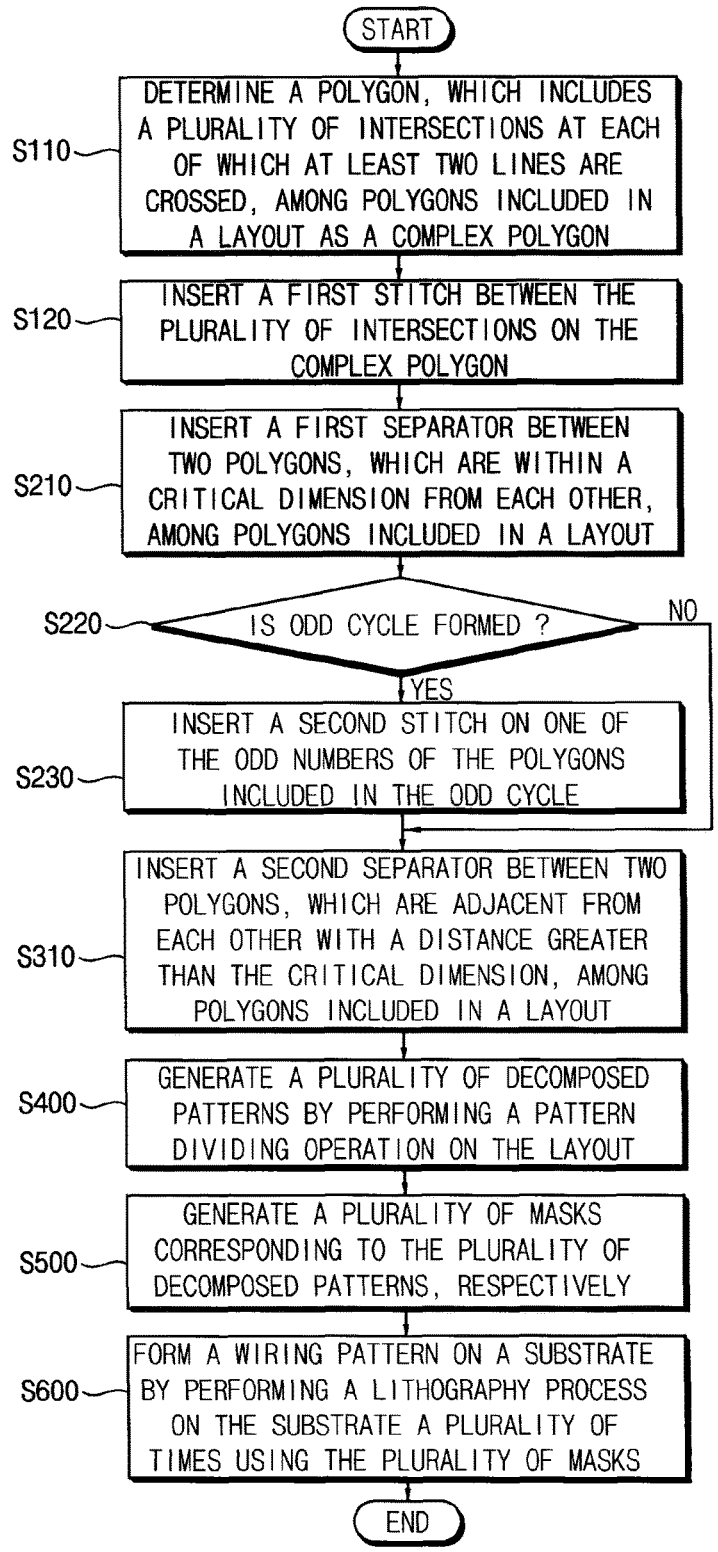
FIG. 35 is a flow chart illustrating an example of the method of manufacturing a semiconductor device of FIG. 34.

FIG. 35 is a flow chart illustrating an example of the method of manufacturing a semiconductor device of FIG. 34.

In the method of manufacturing a semiconductor device of FIG. 35, the pattern dividing operation may be performed to generate the plurality of decomposed patterns after further inserting a first separator, a second stitch and a second separator.

Referring to FIG. 35, before performing the pattern dividing operation, a first separator may be inserted between two polygons, which are within a critical dimension from each other, among the polygons included in the layout (step S210).

After that, it may be determined whether an odd cycle, in which odd numbers of the polygons included in the layout are circularly connected by the first separators, is formed (step S220). When the odd cycle is formed (step S220; yes), a second stitch may be inserted on one of the odd numbers of the polygons included in the odd cycle (step S230).

In addition, before performing the pattern dividing operation, a second separator may be inserted between two polygons, which are adjacent from each other with a distance greater than the critical dimension, among the polygons included in the layout (step S310).

After that, the plurality of decomposed patterns may be generated by performing the pattern dividing operation on the layout including the first separator, the second separator, the first stitch and the second stitch (step S400).

The steps S110, S120, S210, S220, S310 and S400 included in the method of FIG. 35 are the same as the steps S110, S120, S210, S220, S230, S310 and S400 included in the method of FIG. 21. Therefore, duplicate descriptions will be omitted here.

After that, as illustrated in FIGS. 34 and 35, a plurality of masks, which correspond to the plurality of decomposed patterns, respectively, are generated (step S500), and a wiring pattern is formed on a substrate by performing a lithography process on the substrate a plurality of times using the plurality of masks (step S600).

According to example embodiments, various kinds of lithography processes may be used to form the wiring pattern on the substrate based on the plurality of masks.

FIGS. 36 to 42 are diagrams for describing an example of a process of forming a wiring pattern on a substrate of FIGS. 34 and 35.

In FIGS. 36 to 42, a process of forming a wiring pattern on a substrate by performing a lithography process two times using a first mask and a second mask, which is performed after a first decomposed pattern and a second decomposed pattern are generated by performing a pattern dividing operation on a layout of a semiconductor device using a double pattern dividing algorithm used in the DPT process, and the first mask and the second mask, which correspond to the first decomposed pattern and the second decomposed pattern, respectively, are generated, is illustrated as an example.

Figure 36:
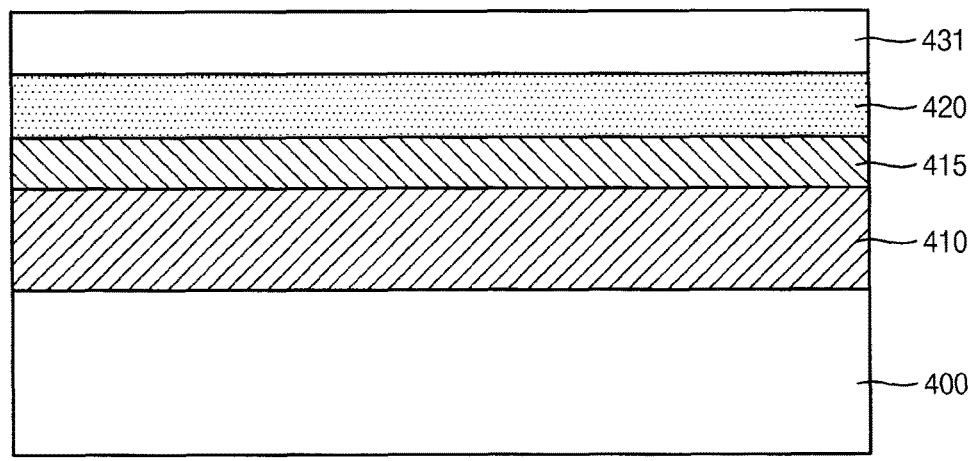
FIGS. 36 to 42 are diagrams for describing an example of a process of forming a wiring pattern on a substrate of FIGS. 34 and 35.

Referring to FIG. 36, an ultra low dielectric layer 410 may be formed on a substrate 400. The substrate 400 may include silicon Si. The ultra low dielectric layer 410 may include a material having an ultra low dielectric constant (ULK).

In example embodiments, the ultra low dielectric layer 410 may correspond to a silicon oxide layer ($SiO_2$) formed by performing an oxidation process on the substrate 400.

A sacrificial layer 415 may be formed on the ultra low dielectric layer 410, and a hard mask layer 420 may be formed on the sacrificial layer 415. As will be described later, a mask pattern may be formed in the hard mask layer 420 by performing a plurality of etching processes on the hard mask layer 420, and trenches may be formed in the ultra low dielectric layer 410 by etching the ultra low dielectric layer 410 using the mask pattern as an etching mask. The sacrificial layer 415 may limit and/or prevent the ultra low dielectric layer 410 from being etched during the plurality of etching processes performed on the hard mask layer 420 to form the mask pattern.

A first photoresist layer 431 may be coated on the hard mask layer 420.

Figure 37:
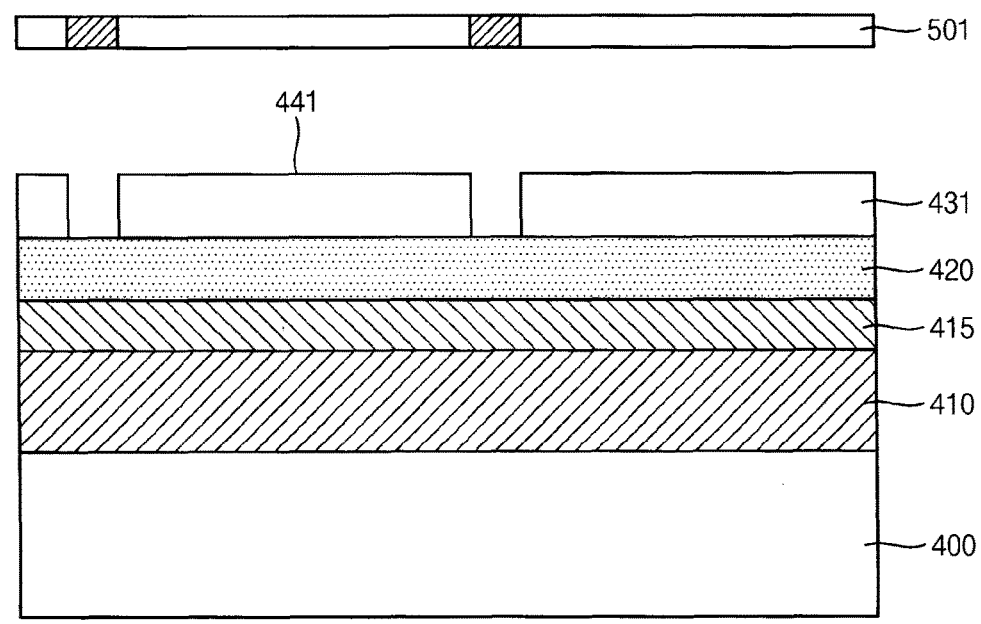

In FIG. 37, a first mask 501 may be manufactured based on the first decomposed pattern DCP1, which is generated by one of the methods of decomposing a layout of a semiconductor device of FIGS. 1, 11, 21 and 32.

Referring to FIG. 37, a first photoresist pattern 441 may be formed by performing a photolithography process and a develop process on the first photoresist layer 431 using the first mask 501.

Figure 38:
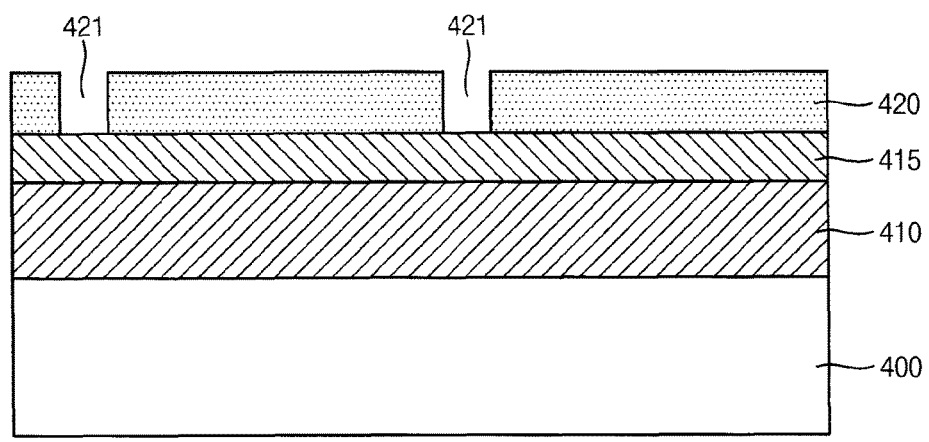

Referring to FIG. 38, a first mask pattern 421 may be formed by etching the hard mask layer 420 using the first photoresist pattern 441 as an etching mask. After that, the first photoresist layer 431 may be removed.

Figure 39:
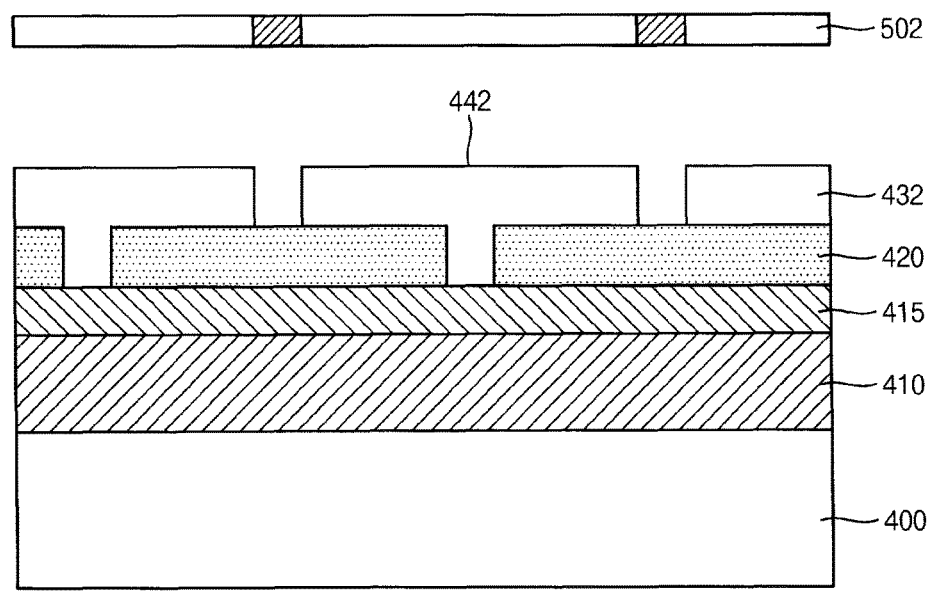

In FIG. 39, a second mask 502 may be manufactured based on the second decomposed pattern DCP2, which is generated by one of the methods of decomposing a layout of a semiconductor device of FIGS. 1, 11, 21 and 32.

Referring to FIG. 39, a second photoresist layer 432 may be coated on the hard mask layer 420, and a second photoresist pattern 442 may be formed by performing a photolithography process and a develop process on the second photoresist layer 432 using the second mask 502.

Figure 40:
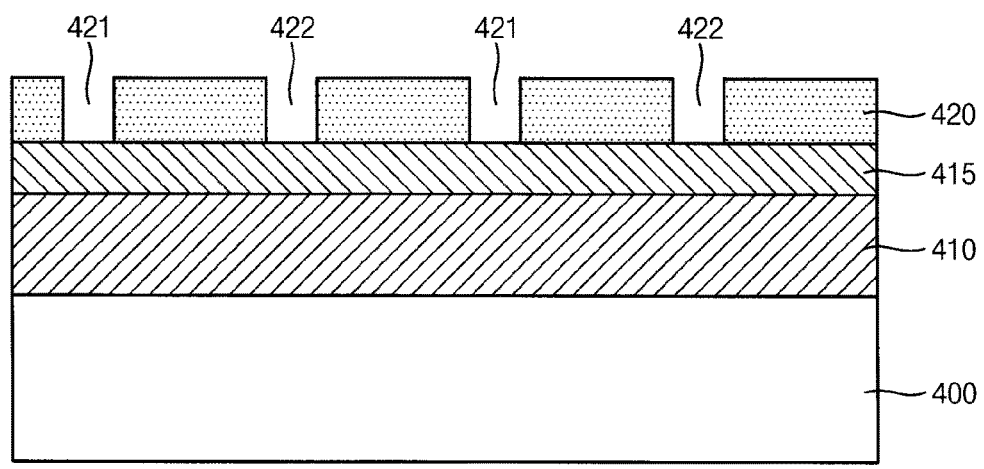

Referring to FIG. 40, a second mask pattern 422 may be formed by etching the hard mask layer 420 using the second photoresist pattern 442 as an etching mask. After that, the second photoresist layer 432 may be removed.

As described above with reference to FIGS. 36 to 40, the first mask pattern 421 and the second mask pattern 422, which correspond to the layout LO of the semiconductor, may be formed in the hard mask layer 420 by performing the DPT process on the substrate 400 using the first decomposed pattern DCP1 and the second decomposed pattern DCP2, which are generated by one of the methods of decomposing a layout of a semiconductor device of FIGS. 1, 11, 21 and 32.

Figure 41:
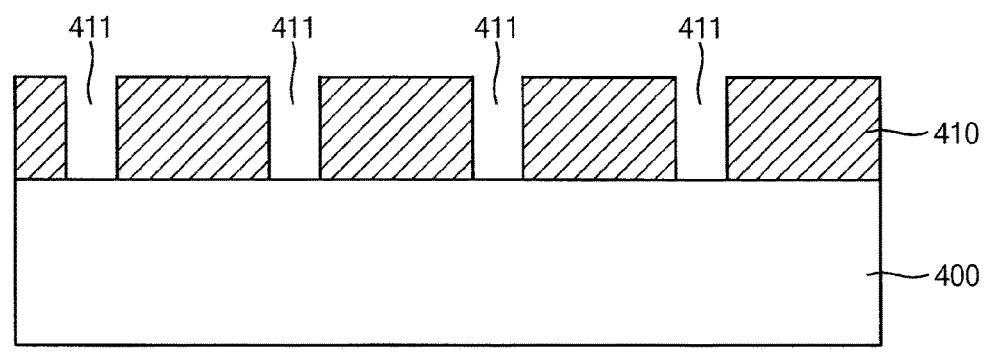

Referring to FIG. 41, trenches 411 may be formed by etching the sacrificial layer 415 and the ultra low dielectric layer 410 using the first mask pattern 421 and the second mask pattern 422 as an etching mask. After that, the hard mask layer 420 and the sacrificial layer 415 may be removed.

Figure 42:
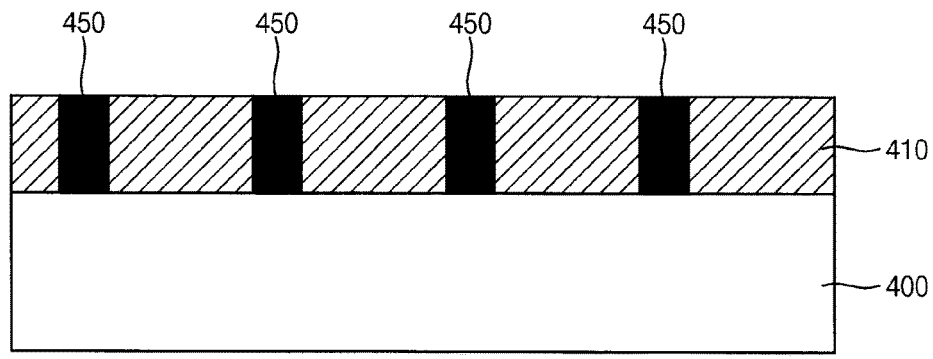

Referring to FIG. 42, a wiring pattern 450 may be formed by filling the trenches 411 with a metallic material.

The method of forming the wiring pattern 450 of the semiconductor device by performing the DPT process on the substrate 400 based on the first decomposed pattern DCP1 and the second decomposed pattern DCP2 is described above with reference to FIGS. 36 to 42 as an example. However, example embodiments are not limited thereto, and the wiring pattern of the semiconductor device may be formed by performing various kinds of DPT processes based on the first decomposed pattern DCP1 and the second decomposed pattern DCP2.

Figure 43:
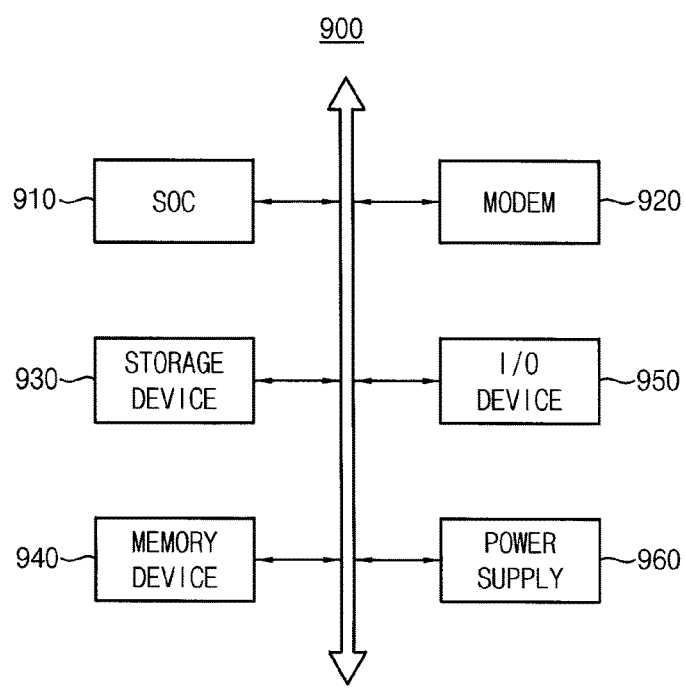
FIG. 43 is a block diagram illustrating a computing system according to example embodiments.

FIG. 43 is a block diagram illustrating a computing system according to example embodiments.

Referring to FIG. 43, a computing system 900 includes a system-on-chip SOC 910, a modem 920, a storage device 930, a memory device 940, an input/output device 950 and a power supply 960.

The system-on-chip 910 controls overall operations of the computing system 900.

The system-on-chip 910 may include various kinds of logic circuits. The system-on-chip 910 may be manufactured using one of the methods of decomposing a layout of a semiconductor device of FIGS. 1, 11, 21 and 32 and one of the methods of manufacturing a semiconductor device of FIGS. 34 and 35.

The modem 920 communicates data with an external device through a wired or wireless communication.

The storage device 930 stores data received from the external device through the modem 920 and data to be transferred to the external device through the modem 920. The storage device 930 may include a non-volatile memory device such as a flash memory device, a solid state drive (SSD), a hard disk drive (HDD), etc.

The memory device 940 stores data required for an operation of the computing system 900. The memory device 940 may include a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 950 may include a touch screen, a keypad, a keyboard, a mouse, a printer, a display, etc. The power supply 960 may supply an operational power.

Although it is not illustrated in FIG. 43, the computing system 900 may further include ports that communicate with a video card, a sound card, a memory card, a universal serial bus (USB) device, or other electronic devices.

The system-on-chip 910 may communicate with the storage device 930, the memory device 940 and the input/output device 950 via an address bus, a control bus, and/or a data bus. In example embodiments, the system-on-chip 910 may be coupled to an extended bus, such as a peripheral component interconnection (PCI) bus.

The computing system 900 may be any computing system including the system-on-chip 910. For example, the computing system 900 may include a digital camera, a mobile phone, a smart phone, a laptop computer, a portable multimedia player (PMP), a personal digital assistant (PDA), etc.

The computing system 900 and/or components of the computing system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of decomposing a layout of a semiconductor device, comprising:
   determining a polygon is a complex polygon among polygons included in the layout of the semiconductor device, the complex polygon including a plurality of intersection where at least two lines are crossed;
   inserting a first stitch between the plurality of intersections on the complex polygon;
   inserting a first separator between two polygons that are within a critical dimension from each other, among the polygons included in the layout;
   determining if an odd cycle is formed among the polygons in the layout that are connected to the first separator, the odd cycle including an odd number of the polygons;
   in response to the odd cycle being formed, inserting a second stitch on one of the odd numbers of the polygons included in the odd cycle; and
   generating a plurality of decomposed patterns by performing a pattern dividing operation on the layout.

2. The method of claim 1, wherein the inserting the first stitch includes inserting the first stitch at a center of two adjacent intersections among the plurality of intersections included in the complex polygon.

3. The method of claim 1, wherein
   the layout includes a plurality of the complex polygons, and
   the inserting the first stitch includes inserting the first stitch between the plurality of intersections on at least one of the plurality of the complex polygons.

4. The method of claim 1, wherein
   the generating the plurality of decomposed patterns includes separating the plurality of decomposed patterns into different decomposed patterns from each other based on at least a first part of the complex polygon and a second part of the complex polygon,
   the first part of the complex polygon is on one side of the first stitch, and
   the second part of the complex polygon that is on an other side of the first stitch.

5. The method of claim 1, wherein
   the generating the plurality of decomposed patterns includes separating the plurality of decomposed patterns into different decomposed patterns from each other based on at least the two polygons, and
   the two polygons are located at respective sides of the first separator.

6. The method of claim 1, further comprising:
   inserting a second separator between two polygons that are adjacent to each other by a distance greater than the critical dimension, among the polygons included in the layout.

7. The method of claim 6, wherein
the generating the plurality of decomposed patterns includes separating the plurality of decomposed patterns into different decomposed patterns from each other based on at least the two polygons, and
the two polygons are located at respective sides of the second separator.

8. The method of claim 6, wherein
the generating the plurality of decomposed patterns includes assigning a first priority while performing the pattern dividing operation to the second separator in response to the second separator being inserted between a first polygon and a second polygon that is apart from the first polygon more than the critical dimension in a direction corresponding to a minor axis of the first polygon, and
the generating the plurality of decomposed patterns includes assigning a second priority while performing the pattern dividing operation to the second separator in response to the second separator being inserted between the first polygon and a third polygon that is apart from the first polygon more than the critical dimension in a direction corresponding to a major axis of the first polygon,
the second priority is lower than the first priority while performing the pattern dividing operation.

9. The method of claim 1, wherein the pattern dividing operation is performed using a double pattern dividing algorithm for a double patterning technology (DPT) process.

10. The method of claim 1, wherein a number of the plurality of decomposed patterns is two.

11. A method of decomposing a layout of a semiconductor device, comprising:
inserting a first separator between two polygons that are within a critical dimension from each other, among polygons included in the layout of the semiconductor device;
inserting a second separator between two polygons that are adjacent to each other by a distance greater than the critical dimension, among the polygons included in the layout; and
generating a plurality of decomposed patterns by performing a pattern dividing operation on the layout.

12. The method of claim 11, further comprising:
determining a polygon among the polygons included in the layout is a complex polygon, the complex polygon including a plurality of intersections where at least two lines are crossed; and
inserting a first stitch between the plurality of intersections on the complex polygon.

13. A method of manufacturing a semiconductor device, comprising:
performing the method of decomposing a layout of a semiconductor device according to claim 1;
generating a plurality of masks corresponding to the plurality of decomposed patterns, respectively; and
forming a wiring pattern on a substrate by performing lithography processes on the substrate using the plurality of masks.

14. A method of decomposing a layout of a semiconductor device, the layout including a plurality of polygons, comprising:
inserting in the layout at least one of,
a first stitch between a plurality of intersections where at least two lines are crossed in at least one complex polygon, in response to the plurality of polygons including the at least one complex polygon, and
a first separator between two polygons that are spaced apart from each other by a distance less than a critical dimension, in response to the plurality of polygons including the two polygons that are spaced apart from each other by the distance less than the critical dimension;
inserting a second separator between two polygons that are spaced apart from each other by a distance greater than the critical dimension in response to the plurality of polygons including the two polygons that are spaced apart from each other by the distance greater than the critical dimension, and
generating a plurality of decomposed patterns by performing a pattern dividing operation on the layout.

15. The method of claim 14, wherein
the method includes inserting the first stitch between the plurality of intersections where at least two lines are crossed in at least one complex polygon,
the generating the plurality of decomposed patterns includes separating the plurality of decomposed patterns into different decomposed patterns based on at least a position of each first stitch in the at least one complex polygon,
the different decomposed patterns include first decomposed patterns and second decomposed patterns,
the first decomposed patterns are based on at least a first part of the at least one complex polygon that is on one side each first stitch,
the second decomposed patterns are based on at least a second part of the at least one complex polygon that is on an other side of each first stitch, and
the first decomposed patterns are different than the second decomposed patterns.

16. The method of claim 14, further comprising:
the method includes inserting the first separator between two polygons that are spaced apart from each other by the distance less than the critical dimension,
the generating the plurality of decomposed patterns includes separating the plurality of decomposed patterns into different decomposed patterns from each other based on at least a position of the first separator relative to the two polygons that are spaced apart from each other by the distance less than the critical dimension,
the decomposed patterns include first decomposed patterns and second decomposed patterns,
at least part of the first decomposed patterns are based on one of the two polygons that are spaced apart from each other by the distance less than the critical dimension,
at least part of the second decomposed patterns are based on an other of the two polygons that are spaced apart from each other by the distance less than the critical dimension, and
the first decomposed patterns are different than the second decomposed patterns.

17. A method of manufacturing a semiconductor device, comprising:
performing the method of decomposing a layout of a semiconductor device according to claim 14;
generating a plurality of masks corresponding to the plurality of decomposed patterns, respectively; and
forming a wiring pattern on a substrate by performing lithography processes on the substrate using the plurality of masks.

* * * * *